US009660336B2

(12) United States Patent
Anderson et al.

(10) Patent No.: US 9,660,336 B2
(45) Date of Patent: May 23, 2017

(54) SYSTEMS, DEVICES AND METHODS FOR TRANSMITTING ELECTRICAL SIGNALS THROUGH A FARADAY CAGE

(71) Applicants: Kevan Anderson, Oshawa (CA); General Leung, Sheffield (GB); Garry Liu, Toronto (CA); Perry Radau, Toronto (CA); Graham Wright, Toronto (CA)

(72) Inventors: Kevan Anderson, Oshawa (CA); General Leung, Sheffield (GB); Garry Liu, Toronto (CA); Perry Radau, Toronto (CA); Graham Wright, Toronto (CA)

( * ) Notice: Subject to any disclaimer, the term of this patent is extended or adjusted under 35 U.S.C. 154(b) by 104 days.

(21) Appl. No.: 14/766,262

(22) PCT Filed: Feb. 7, 2014

(86) PCT No.: PCT/CA2014/050086
§ 371 (c)(1),
(2) Date: Aug. 6, 2015

(87) PCT Pub. No.: WO2014/121402
PCT Pub. Date: Aug. 14, 2014

(65) Prior Publication Data
US 2015/0372378 A1    Dec. 24, 2015

Related U.S. Application Data

(60) Provisional application No. 61/762,208, filed on Feb. 7, 2013, provisional application No. 61/778,058, filed on Mar. 12, 2013.

(51) Int. Cl.
*G01R 33/36* (2006.01)
*H01P 3/06* (2006.01)
(Continued)

(52) U.S. Cl.
CPC ............. *H01Q 1/50* (2013.01); *G01R 33/283* (2013.01); *G01R 33/36* (2013.01); *H01P 3/06* (2013.01); *H01P 3/12* (2013.01)

(58) Field of Classification Search
CPC ...... G01R 33/283; G01R 33/36; H01Q 17/00; H01P 3/06; H01P 3/12
(Continued)

(56) References Cited

U.S. PATENT DOCUMENTS 4,885,538 A    12/1989    Hoenniger, III et al.
5,172,085 A *  12/1992    Glenat .................. G01R 33/24
                                                        324/318

(Continued)

FOREIGN PATENT DOCUMENTS

WO         0064335       11/2000
WO      2007132396       11/2007
(Continued)

OTHER PUBLICATIONS

Liu et al., Meeting of the International Society for Magnetic Resonance in Medicine, Toronto, Canada, 2008. #114. "On the operation of Bluetooth devices inside the MR Faraday cage".
(Continued)

*Primary Examiner* — Dean Takaoka
*Assistant Examiner* — Alan Wong
(74) *Attorney, Agent, or Firm* — Lynn C. Schumacher; Stephen W. Leonard; Hill & Schumacher

(57) ABSTRACT

Embodiments of the present disclosure provide devices, methods, and systems that support electrical connection, signal delivery, and/or communication between internal and external portions of a Faraday cage. In some embodiments, devices and methods are provided for transmitting electrical signals through a waveguide port of a Faraday cage. In some embodiments, aspects of the present disclosure are
(Continued)

employed to adapt a magnetic resonance imaging system for communications between a scanner room and a control room.

21 Claims, 28 Drawing Sheets

(51) Int. Cl.
  *H01Q 1/50* (2006.01)
  *G01R 33/28* (2006.01)
  *H01P 3/12* (2006.01)

(58) Field of Classification Search
  USPC .................................. 333/24 R; 324/318, 322
  See application file for complete search history.

(56) References Cited

U.S. PATENT DOCUMENTS

| | | | |
|---|---|---|---|
| 5,494,036 A | 2/1996 | Uber, III et al. | |
| 5,552,708 A | 9/1996 | Ham | |
| 6,463,316 B1 | 10/2002 | Brungart | |
| 6,535,084 B1* | 3/2003 | Tropp | H01P 7/00 324/318 |
| 7,221,159 B2 | 5/2007 | Griffiths et al. | |
| 7,283,860 B2 | 10/2007 | Frazier et al. | |
| 7,292,704 B2 | 11/2007 | Lederer | |
| 7,898,356 B2* | 3/2011 | Sherrer | H01P 3/06 29/828 |
| 8,214,012 B2 | 7/2012 | Zuccolotto et al. | |
| 8,344,829 B2* | 1/2013 | Miller, II | H01P 3/06 333/24 R |
| 9,065,163 B1* | 6/2015 | Wu | H01P 3/12 |
| 9,306,656 B2* | 4/2016 | Ong | H01Q 1/007 |
| 2002/0133071 A1 | 9/2002 | Wolff et al. | |
| 2003/0058502 A1 | 3/2003 | Griffiths et al. | |
| 2005/0107681 A1 | 5/2005 | Griffiths | |
| 2005/0197565 A1 | 9/2005 | Yagi et al. | |
| 2006/0287593 A1 | 12/2006 | Jaggu et al. | |
| 2011/0124301 A1 | 5/2011 | Prasidh et al. | |
| 2011/0237932 A1 | 9/2011 | Staats et al. | |
| 2012/0143040 A1 | 6/2012 | Goswami et al. | |
| 2012/0215092 A1 | 8/2012 | Harris, III et al. | |
| 2012/0316428 A1 | 12/2012 | Guttler et al. | |
| 2013/0182085 A1 | 7/2013 | Ziarati | |
| 2013/0201651 A1 | 8/2013 | Schnekenburger et al. | |
| 2014/0354279 A1* | 12/2014 | Dumoulin | G01R 33/422 324/318 |

FOREIGN PATENT DOCUMENTS

| | | |
|---|---|---|
| WO | 2011072667 | 6/2011 |
| WO | 2012154961 | 11/2012 |

OTHER PUBLICATIONS

International Search Report in PCT/CA2014/050086, dated Jul. 11, 2014.

Written Opinion in PCT/CA2014/050086, dated Jul. 11, 2014.

* cited by examiner

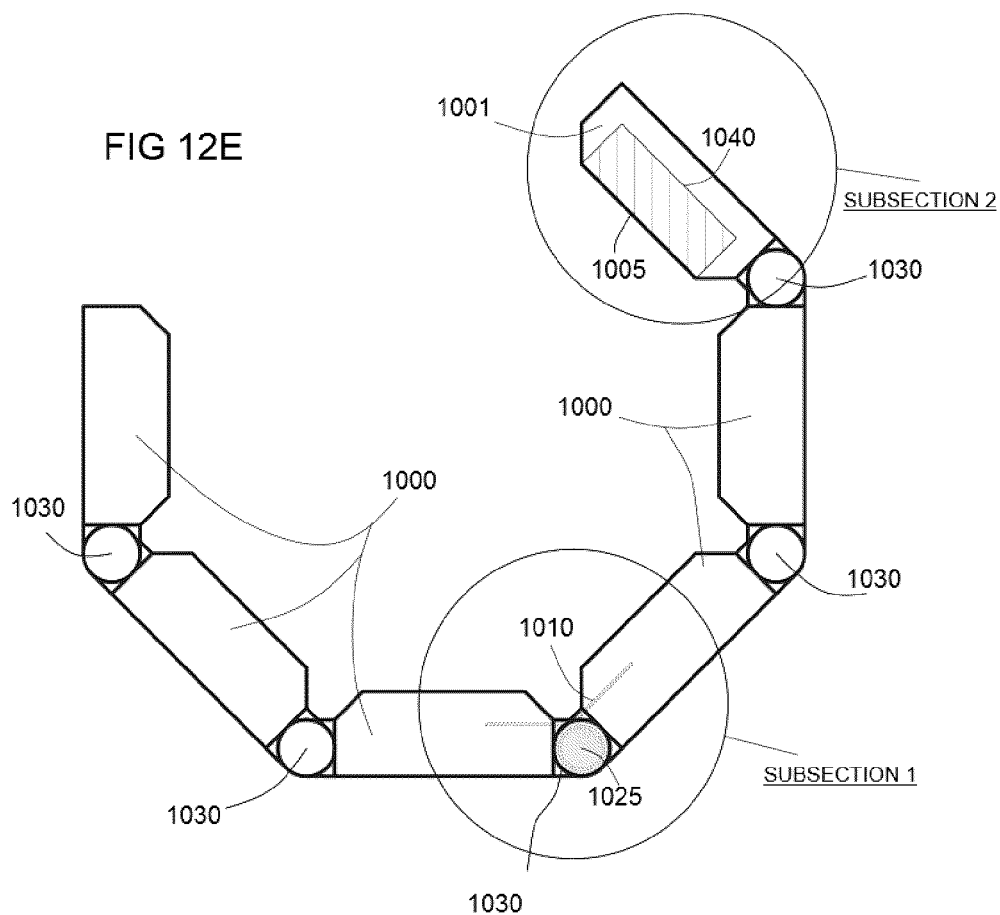
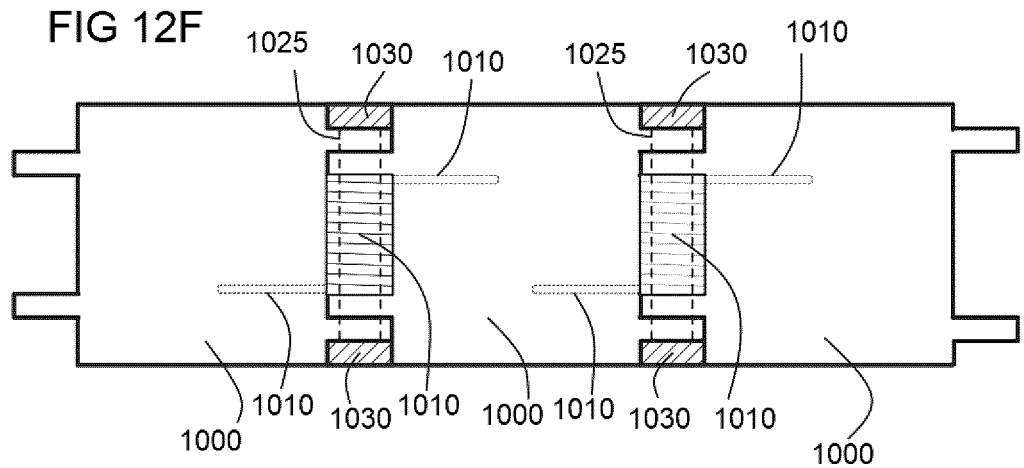

SYSTEMS, DEVICES AND METHODS FOR TRANSMITTING ELECTRICAL SIGNALS THROUGH A FARADAY CAGE

CROSS-REFERENCE TO RELATED APPLICATION

This application is a National Phase application claiming the benefit of PCT/CA2014/050086 filed on Feb. 4, 2014, in English, which further claims priority to U.S. Provisional Application No. 61/762,208, titled "SYSTEMS, DEVICES AND METHODS FOR TRANSMITTING ELECTRICAL SIGNALS THROUGH A FARADAY CAGE" and filed on Feb. 7, 2013, the entire contents of which is incorporated herein by reference, and to U.S. Provisional Application No. 61/778,058, titled "SYSTEMS, DEVICES AND METHODS FOR TRANSMITTING ELECTRICAL SIGNALS THROUGH A FARADAY CAGE" and filed on Mar. 12, 2013, the entire contents of which is incorporated herein by reference.

BACKGROUND

The present disclosure relates to electromagnetically shielded environments. More particularly, the present disclosure relates to magnetic resonance imaging systems.

The use of magnetic resonance (MR) imaging has expanded from diagnostic imaging to include the guidance of a variety of interventions. These include, MR-guided biopsies, and ablation therapies performed by both radiofrequency (RF) energy and high-intensity focused ultrasound.

Many diagnostic and interventional procedures require or are aided by the presence of a clinician, staff or family members inside the Faraday cage. The purpose of the Faraday cage is to block any electromagnetic energy within the operating bandwidth of the MR scanner (typically 64 MHz+/−250 kHz for a 1.5T system and 128 MHz+/−250 kHz for a 3T system). This eliminates outside interference with the scanner and preserves image quality.

It is often desirable for people inside the Faraday cage to communicate with people outside of the Faraday cage; this is particularly true in the case of interventional procedures. In addition to the need for communication, peripheral devices that enable the visualization of images and the interactive control of the MR scanner are also desirable.

Currently, there are wired solutions that enable communication between the control room and the scanner room, however, the presence of wires in either room attached to individuals can be very cumbersome, especially when a clinical procedure is taking place and people are required to move around the room. Communication with someone inside a scanner room is further hindered by the loud noises generated by the MR scanner.

Wireless technologies are beneficial in that they reduce the clutter caused by numerous wired peripheral devices. In an MR suite, however, wireless signals originating from inside the scan room are unable to reach the adjacent control room due to the Faraday cage. Similarly, the Faraday cage also prevents wireless signals originating from the control room to propagate into the scanning room.

SUMMARY

Embodiments of the present disclosure provide devices, methods, and systems that support electrical connection, signal delivery, and/or communication between internal and external portions of a Faraday cage. In some embodiments, devices and methods are provided for transmitting electrical signals through a waveguide port of a Faraday cage. In some embodiments, aspects of the present disclosure are employed to adapt a magnetic resonance imaging system for communications between a scanner room and a control room.

Accordingly, in one aspect, there is provided a device for transmitting electrical signals through a waveguide port of a Faraday cage, the device comprising:
   at least one shielded transmission line comprising an outer conductor and at least one inner conductor, wherein the shielded transmission line has a length suitable for spanning at least a portion of the waveguide port; and
   a support structure configured to support the at least one shielded transmission line within the waveguide port while maintaining electrical contact between the outer conductor and the Faraday cage, such that the presence of the device within the waveguide port does not compromise the function of the waveguide port as a high pass transmission waveguide.

In another aspect, there is provided a method of transmitting an electrical signal through a waveguide port of a Faraday cage using a waveguide insert;
   the waveguide insert comprising:
      a transmission line comprising an outer conductor and at least one shielded inner conductor, wherein the transmission line has a length suitable for spanning at least a portion of the waveguide port; and
      a support structure configured to support said transmission line within the waveguide port while maintaining electrical contact between said outer conductor and said waveguide port;
   the method comprising:
   inserting the waveguide insert within the waveguide port, such that electrical contact is made between said outer conductor and said waveguide port; and
   transmitting the electrical signal through the transmission line.

In another aspect, there is provided a communication system for providing wireless communication within a Faraday cage, the Faraday cage comprising a waveguide port, the system comprising:
   at least one shielded transmission line comprising an outer conductor and at least one inner conductor, wherein the shielded transmission line has a length suitable for spanning at least a portion of the waveguide port; and
   a support structure supporting the at least one shielded transmission line within the waveguide port while maintaining electrical contact between the outer conductor and the Faraday cage, such the function of the waveguide port as a high pass transmission waveguide is not compromised;
   an antenna connected to one end of the transmission line, such that the antenna is capable of receiving and/or transmitting wireless signals to or from one or more wireless devices within the Faraday cage; and
   a transceiver provided outside of the Faraday cage, wherein the transceiver is connected to the other end of the shielded transmission line for transmitting wireless signals to, and/or receiving wireless signals from, the antenna.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIG. 12E is an illustration of an example neck band with an integrated conduction microphone.

FIG. 12F is a side view of an example neck band with an integrated conduction microphone.

DETAILED DESCRIPTION

Figure 1A:
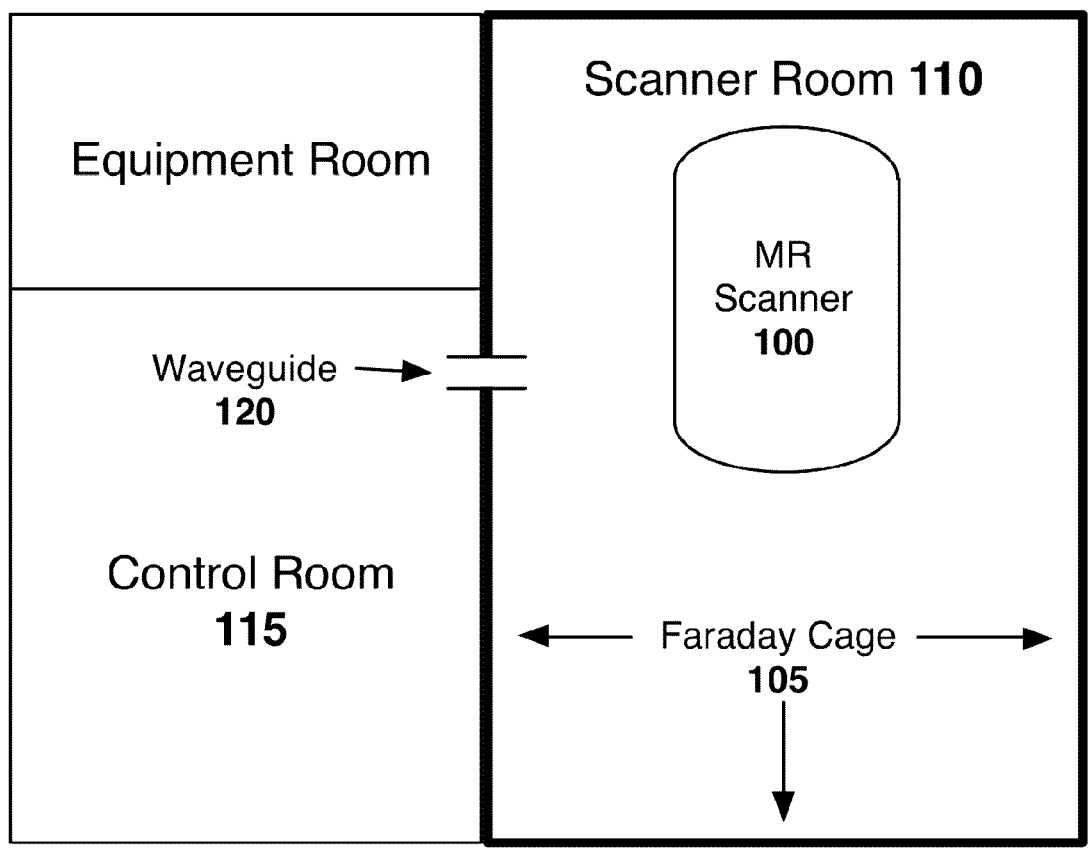
FIG. 1A is a schematic diagram of a typical MR imaging suite comprising an MR imaging scanner, scanning room, control room, Faraday cage, and a waveguide.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

As used herein, the term "quickly-removable contact" refers to contacts which encounter only frictional resistance upon attempted removal. Such contacts are maintained without modifying the target of affixment.

As used herein, the phrase "Faraday cage" refers to an enclosure formed from a conductive material, such that electromagnetic waves are prevented from passing into or out the enclosed volume. In some embodiments, a Faraday cage may be formed from a solid conductive material, while in other embodiments, a Faraday cage may be formed from a conductive mesh. A "Faraday cage" may also be referred to as a "Faraday shield" or a "Faraday screen".

As used herein, the term "waveguide port" refers to a hollow conductive structure penetrating a Faraday cage, where the hollow conductive structure is configured to act as a high-pass filter. In some embodiments, the waveguide port may have a size that is suitable for moving items into or out of a Faraday cage.

As used herein, the phrases "in electrical contact" and "in electrical communication" refer to two or more conductors having substantially the same electrical potential due to direct or indirect electrical contact between the conductors.

Embodiments of the present disclosure provide devices, methods, and systems that support electrical connection, signal delivery, and/or communication between internal and external portions of a Faraday cage. In some embodiments, devices and methods are provided for transmitting electrical signals through a waveguide port of a Faraday cage. In some embodiments, aspects of the present disclosure are employed to adapt a magnetic resonance imaging system for communications between a scanner room and a control room.

With reference to FIG. 1A, a conventional magnetic resonance system is illustrated. MR scanner 100 is situated in scanner room 110, which is surrounded by a Faraday cage 105. Faraday cage 105 is an enclosure formed with conducting material (either in solid or mesh form). Such an enclosure attenuates ambient RF signals and prevents them from entering the MR scanner room. Faraday cage 105 is often located within the walls and windows of MR scanner room 110. Much of the controlling and operation of MR scanner 100 occurs in adjacent control room 115.

As shown in FIG. 1A, a waveguide port 120 is provided within Faraday cage 105. Waveguide port 120 is a conductive passage that is electrically connected to Faraday cage 105, and forms an opening through Faraday cage 105. Waveguide port 120 has dimensions that are selected such it acts as a high pass filter to electromagnetic waves, with a cut-off frequency well above the operational frequency of MR scanner 100. As a result, MR image quality is not compromised by the presence of waveguide port 120. Waveguide port 120 may be employed, for example, to permit the passage of non-conductive materials, such as anaesthesia tubes, between scanner room 110 and control room 115. In one non-limiting embodiment, an example waveguide port may be a substantially cylindrical tube, formed from a conductive material, with a diameter of approximately 10 cm and a length of approximately 30 cm.

Although waveguide port 105 is designed to function as a high pass filter, when conductive materials such as wires or cables are present within waveguide port 120, the electromagnetic properties of waveguide port 120 change such that all electromagnetic energy (regardless of frequency) is able to propagate therethrough.

For any conducting hollow guide, including those that are circular or rectangular in cross section, the electric potential of the interior of the conductor is a constant. The consequence of this is that, according to the wave equation, the only electromagnetic propagation modes that are able to exist are the transverse magnetic (TM) or transverse electric (TE) modes. Both of these propagation modes have distinct cutoff frequencies whereby only electromagnetic waves above the cutoff frequency are able to propagate through the hollow guide.

If one or more conductors are placed through the hollow guide, such that the conductor is not at the same electric potential as the interior surface of the hollow conductor, it is possible for a transverse electromagnetic (TEM) propagation mode to exist. A property of TEM propagation modes is that they have no cutoff frequency and, as such, broadband electromagnetic energy at any frequency is able to propagate through the guide.

In order to pass a conductor through the hollow guide while maintaining the inability for TEM propagation modes to exist, it is necessary for conductors in the waveguide to be at the same potential as the interior surface of the hollow guide (i.e. be equipotential with the interior surface of the hollow guide). As taught in several embodiments of the present disclosure, this can be accomplished through electrical connections. It should be noted that in order for equipotential to be maintained, it is important that electrical connections between the conductor and hollow guide are made within short distances with respect to the wavelength of the electromagnetic energy. In general, the distance should be sufficiently short to establish an equipotential connection for maintaining the properties of the waveguide and prohibit TEM waves from propagating. For example, in one embodiment, electrical connections are made to within one eighth of a wavelength.

Accordingly, waveguide port 120 may be employed as a conduit for non-conductive signal-carrying cables such as optical fibers, but cannot be employed as a conduit for passing an electrical wire or cable between scanner room 110 and control room 115 without resulting in a significant degradation in MR image quality.

Figure 1B:
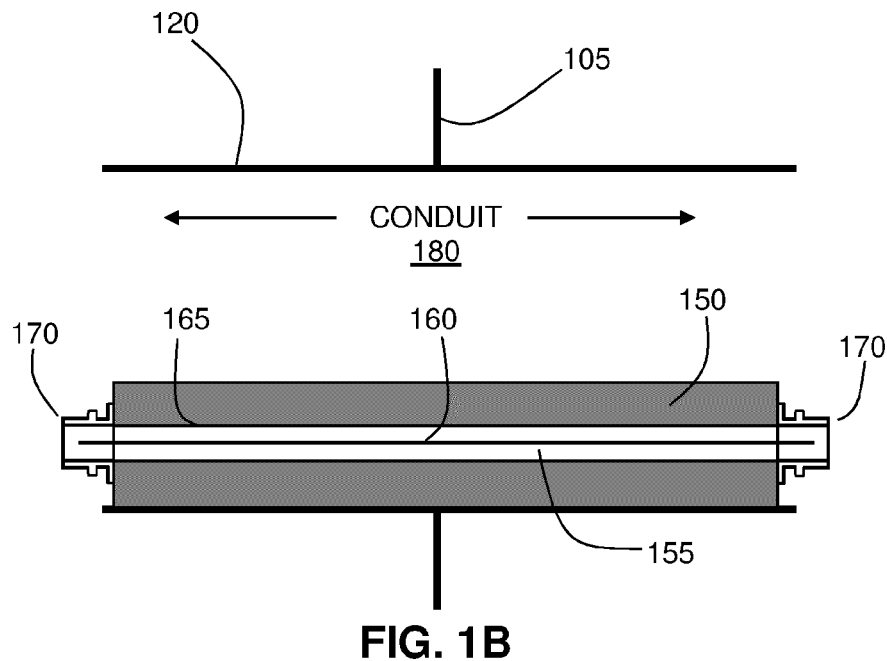
FIGS. 1B-1K illustrate various embodiments of example waveguide insert for transmitting electrical signals across a Faraday cage.
Figure 1C:
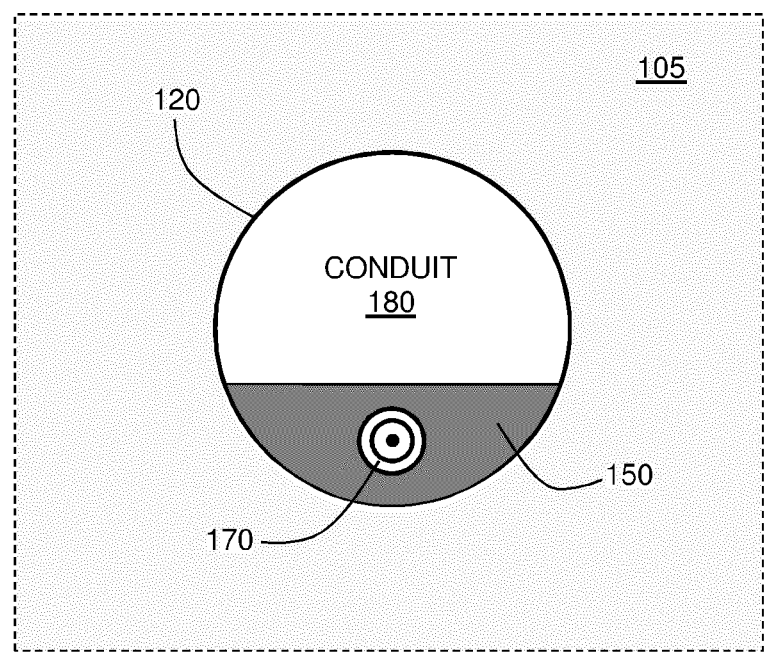

As shown in FIGS. 1B and 1C, and according to various embodiments henceforth disclosed, the inability of waveguide port 120 to function as a conduit for an electrical cable is overcome by the incorporation, into waveguide port 120, of waveguide insert 150. Example waveguide insert 150 is made from an electrically conductive material and includes a coaxial transmission line 155 traversing its length, providing an electrical signal delivery channel. Coaxial transmission line 155 includes inner conductor 160 and outer conductor 165. In the example embodiment shown, connectors 170 are provided for making external connections to waveguide insert 150 on either side of Faraday cage 105.

In order to avoid the MR signal degradation that would otherwise occur as a result of the insertion of a coaxial cable within waveguide port 120, waveguide insert 150 is adapted such that electrical contact is made between outer (shielding) conductor 165 and Faraday cage 105 when waveguide insert 150 is placed within waveguide port 120. In the example embodiment shown, this electrical contact is made as a result of:

(a) electrical contact between outer conductor 165 and waveguide insert 150;

(b) electrical contact between waveguide insert 150 and conductive waveguide port 120; and (c) electrical contact between waveguide port 120 and Faraday cage 105.

As a result of the electrical contact noted above, outer conductor 165 of coaxial transmission line 160 is maintained at the same potential as Faraday cage 105. This equipotential relationship prohibits waveguide port 120 and outer conductor 165 from acting as a broadband coaxial transmission line for electromagnetic waves. Furthermore, outer conductor 165 shields inner conductor 160 from waveguide port 120, such that the presence of inner conductor 160 does not affect the transmission bandwidth of waveguide port 120.

Waveguide insert 150 thus provides an electrical channel traversing waveguide port 120 without resulting in a reduction in the performance of MR scanner 100. Ambient RF energy that is present in the control room that is within the operating bandwidth of the MR scanner is therefore unable to propagate along outer (shielding) conductor 165 of the coaxial transmission line and degrade image quality. Furthermore, as shown in FIGS. 1B and 1C, a substantial portion of the volume enclosed by waveguide port 120 remains open and available as a conduit 180 for passing non-conductive tools, devices, and/or other materials, between scanner room 110 and control room 115.

In the embodiment shown in FIGS. 1B and 1C, waveguide insert 150 is electrically conductive, and thus makes electrical contact with waveguide port 120 simply through contact under its own weight. It is to be understood, however, that waveguide insert need not be fully conductive. In other embodiments, waveguide insert 150 may be formed, in part, by an electrically insulating material, provided that at least a portion of waveguide insert 150 is configured to make electrical contact (i.e. to be in electrical communication) with waveguide port 120 at one or more locations.

Figure 1D:
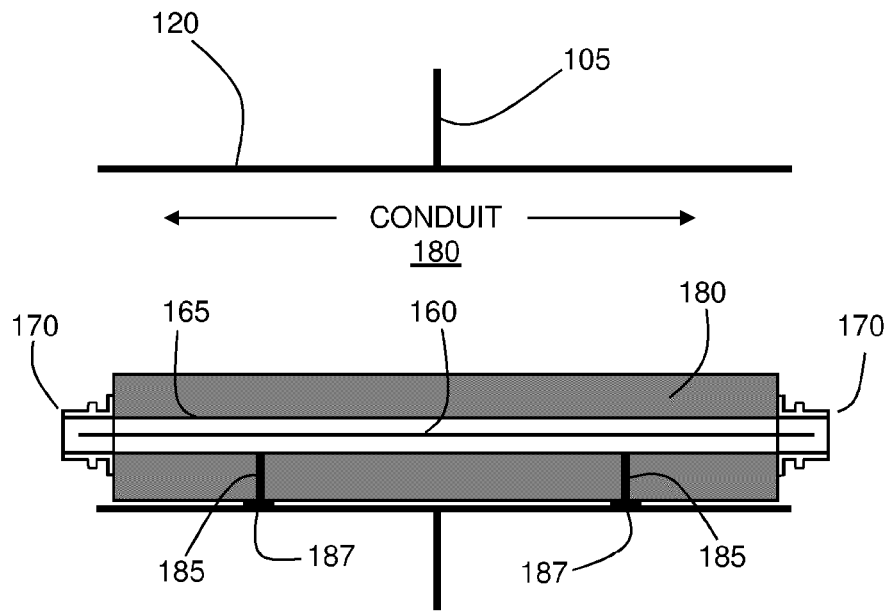

FIG. 1D illustrates an example embodiment in which waveguide insert 180 is formed from a substantially non-conductive material, and wherein one or more conductive vias 185 (or channels, wires, taps or shunts) are provided for establishing electrical contact between outer conductor 165 and waveguide port 120. For example, as shown in FIG. 1D, conductive vias 185 may be provided that emerge through the outer wall of waveguide insert 120. The conductive vias 185 may terminate in outer contacts 187 (e.g. conductive fingers, pads, feet, or other suitable conductive contact elements) that are located to make contact with waveguide port 120.

Figure 1E:
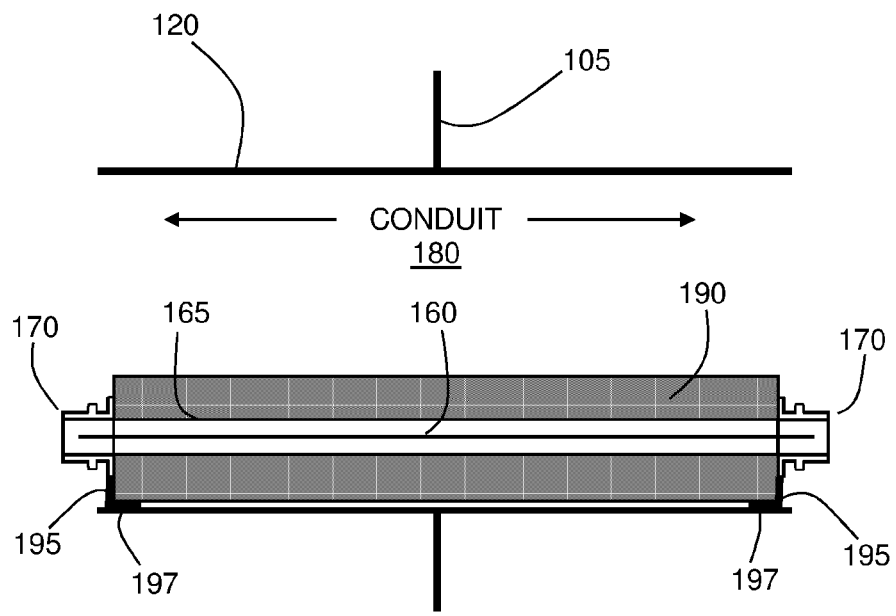

FIG. 1E illustrates another example embodiment in which waveguide insert 190 is formed from a substantially non-conductive material, and where electrical and external connection is made between waveguide insert 120 and outer conductor 165 via connector 170. Conductive path 195 establishes an electrical connection between contact 197 (that configured to electrically contact waveguide port 120), and connector 170 (the outer portion of which is electrically connected to outer conductor 165). Although FIG. 1E shows such connections made at both ends of waveguide port 120, it is to be understood that in other embodiments, a single connection may be made at one end of waveguide port 120.

Figure 1F:
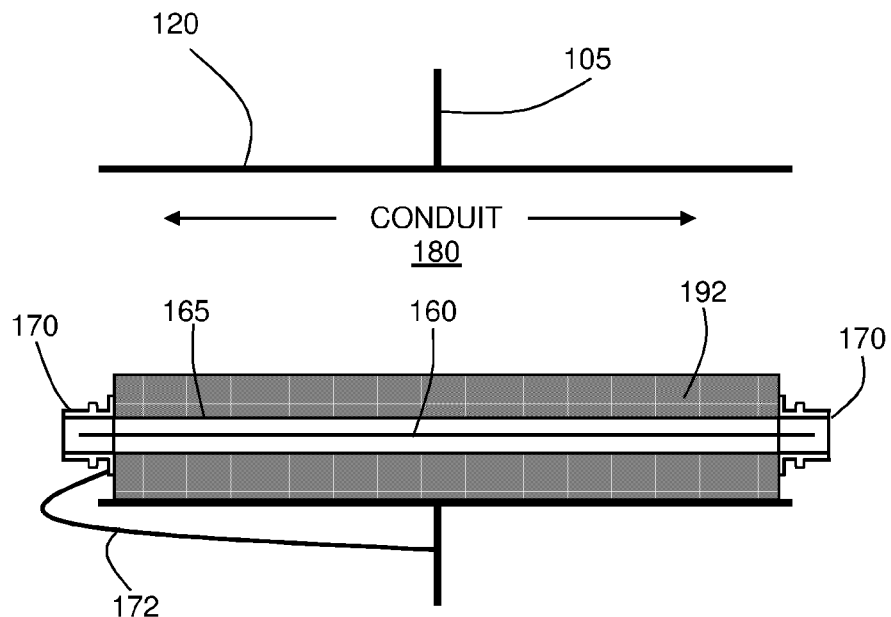

In FIG. 1F, an example implementation is shown in which waveguide insert 192 is non-conductive, and where outer conductor 165 is electrically connected to Faraday cage 105 through external connecting wire 172, which connects indirectly to outer conductor 165 via connector 170. Alternatively, a connection may be made directly to outer conductor 165 by providing an internal connection through waveguide insert 192.

Figure 1G:
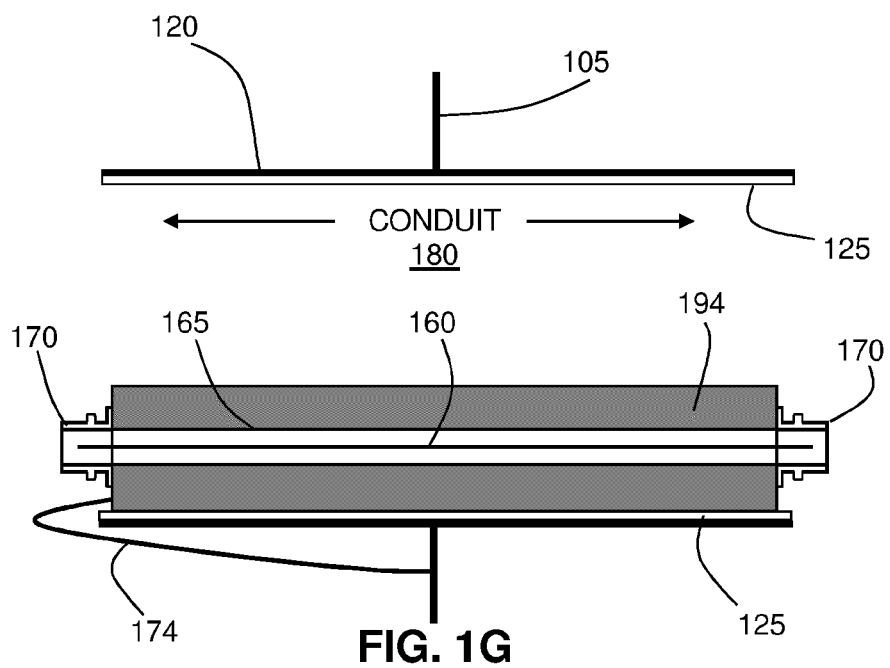

An alternative embodiment is shown in FIG. 1G, in which waveguide insert 194 is conductive and in electrical contact with outer conductor 165, but where waveguide port 120 includes a non-conductive layer 125 preventing direct electrical contact between waveguide insert 194 and waveguide port 120. For example, one example embodiment, non-conductive layer 125 may be a coating layer (such as a polymer layer) applied to the inner surface of waveguide port 120. In another example embodiment, non-conductive layer 125 may be an oxide layer forming an insulating barrier preventing direct electrical contact (such as aluminum oxide). As shown, an external electrical connection between waveguide insert 194 and Faraday cage 105 may be made by external wire 174. External wire 174 may connect to a conductive portion of waveguide insert 120, or alternatively to another suitable conductive surface that is in electrical contact with outer conductor 165, such as connector 170. Although only a single external connection is shown in FIGS. 1F and 1G, it is to be understood that two or more such connections may be made in alternative embodiments.

Figure 1H:
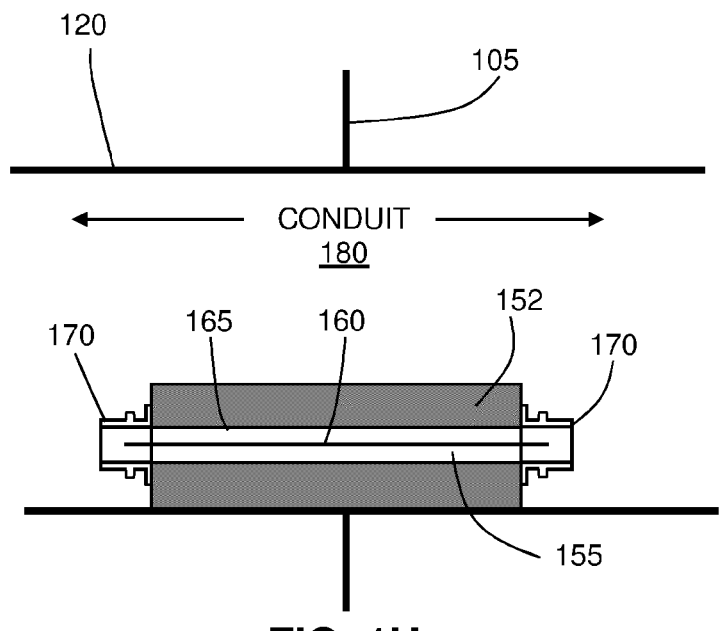

While FIGS. 1A-G show example embodiments in which the waveguide insert traverses a substantial longitudinal portion of the waveguide port, it is to be understood that in alternative embodiments, the waveguide insert may only traverse a subset or portion of the overall longitudinal length of the waveguide port, provided that electrical components or cables that are connected to the waveguide insert within the waveguide port are shielded. Referring now to FIG. 1H, an example implementation is shown in which waveguide insert 152 spans only a subset of the overall longitudinal extent of waveguide port 120.

Figure 1I:
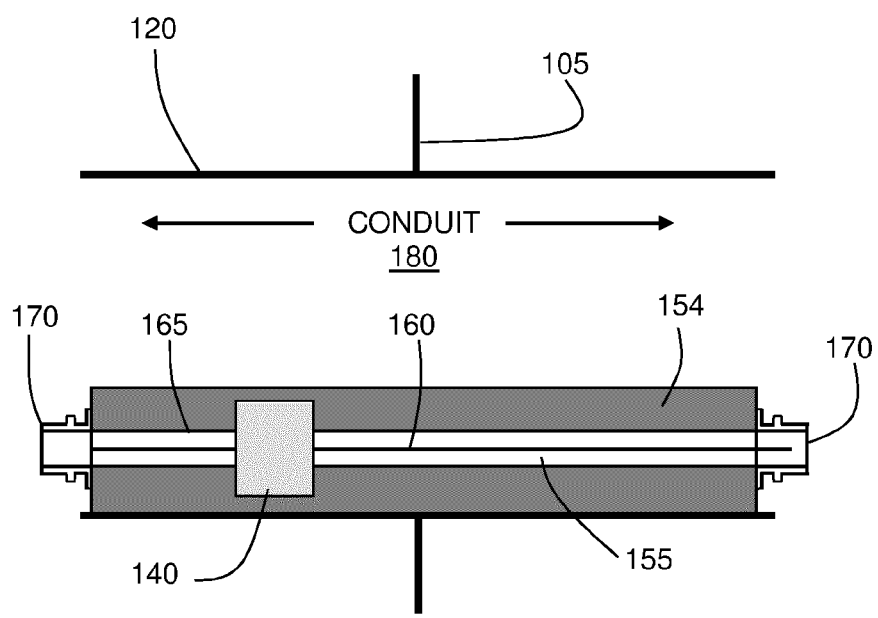

Furthermore, in some embodiments, one or more electrical elements may be provided within or external to the waveguide insert. Referring to FIG. 1I, an example embodiment is provided in which signal conditioning element 140 is provided within waveguide insert 154, and wherein signal conditioning element 140 is in electrical communication with coaxial transmission line 155 for conditioning the signals propagating therein or for otherwise modifying the electrical properties of the transmission line or circuit. Examples of electrical components include passive and/or active electrical components for the purposes of, but not limited to, signal filtering and/or signal amplification.

Figure 1J:
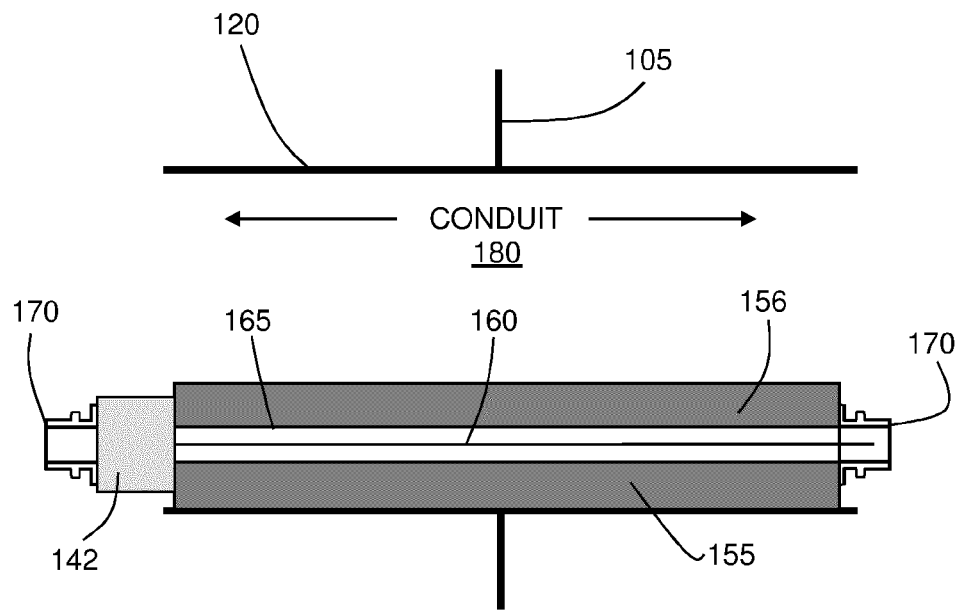

For example, in one embodiment, signal conditioning element 140 is an electrical filter. In another example embodiment, signal conditioning element is one or more impedance matching elements. It is to be understood that signal conditioning element 140 may be located in a number of different configurations. For example, FIG. 1J illustrates another example embodiment in which signal conditioning element 142 is connected to one side of waveguide insert 156. In some embodiments, the signal conditioning element may be tunable, for example, for tuning the impedance of the waveguide insert.

The preceding Figures have illustrated example implementations in which connectors are provided on either side of the waveguide insert for removably attaching electrical cables and/or components on either side of the Faraday cage. For example, in some embodiments and applications, the waveguide insert may be employed for providing a rapid and removable patch-through connection, enabling the connection of electrical signal-carrying cables across/into the Faraday cage through the waveguide port. In other embodiments, one or both sides of the waveguide insert may be connected, either removably or permanently, to one or more electrical components.

Figure 1K:
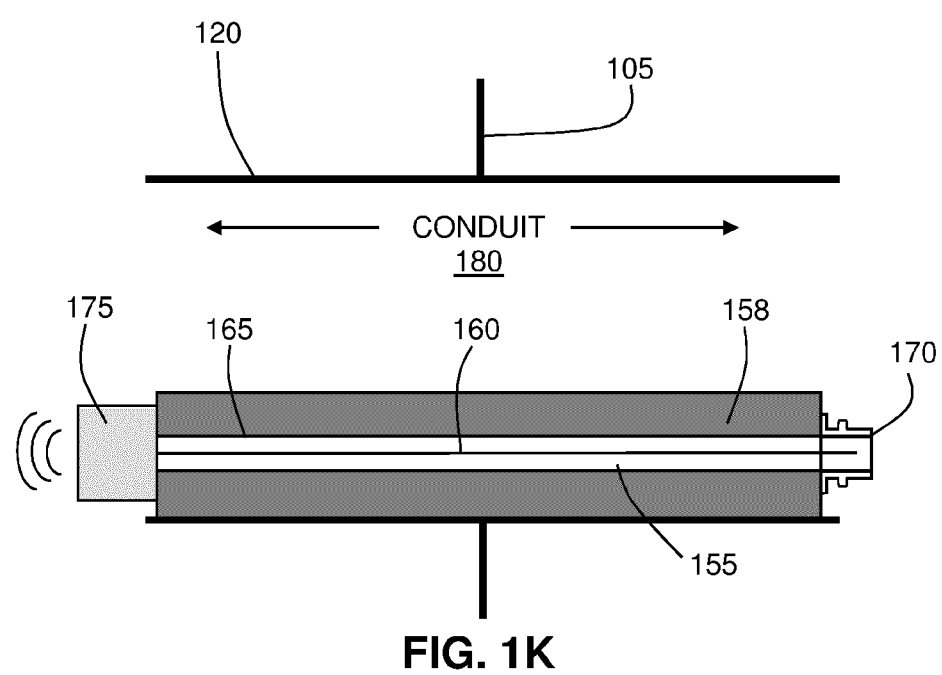

FIG. 1K illustrates an example embodiment in which waveguide insert 158 is configured such that connector 170 is provided on one side of Faraday cage 105, and electrical component 175 is connected to waveguide insert on another side of Faraday cage 105. In the example embodiment that is illustrated in the Figure, electrical component 175 is an antenna that is configured to radiate radio waves within a Faraday cage, thereby supporting wireless communication within Faraday cage 105. Wireless signals may be provided from outside of the Faraday cage 105 through connector 170 for transmission by antenna 175 within Faraday cage 105, and wireless signals received by antenna 175 from within Faraday cage 105 may be detected outside of Faraday cage 105 via electronic circuits and/or devices connected to connector 170. For example, a transceiver may be connected to connector 170 to achieve this functionality, as described in further detail in the example embodiments provided below. It is to be understood that the electrical properties of transmission line 155 may be selected to support the efficient transmission of electrical signals and/or the efficient delivery of power, for example, without substantial losses, standing waves, and/or multi-path interference.

Although FIG. 1K illustrates an example embodiment in which an antenna is provided on one side of waveguide insert, it is to be understood that in other embodiments, the waveguide insert may be configured to support the transmission and reception of both wired and/or wireless RF signals by providing, for each terminal of a transmission line provided within the waveguide insert, an electrical connector or an antenna/transceiver for wired or wireless connections, respectively. Accordingly, in some embodiments of the present disclosure, wired or wireless interfacing devices may be provided on either or both sides of the waveguide insert, where the devices transmit and receive electrical signals through the waveguide insert.

It should be noted that while the transmission lines illustrated in the example implementations described herein show coaxial transmission lines within the waveguide insert, other types of transmission lines may be employed, provided that an outer shield is provided that is electrically connectable to the Faraday cage through the waveguide insert. Non-limiting examples of other transmission lines include triaxial cables and shielded general purpose cables.

Although many example embodiments provided herein relate to the transmission of electrical signals through the waveguide inset, it is to be understood that the terms, "signal" and "signals", as used herein, are not intended to limit the embodied applications of the present disclosure to be within the scope of communications. For example, a "signal" may be any electrical signal that varies as a function of time, and its transmission through the waveguide insert may facilitate, for example, communication of information or other data. The signal frequency spectrum may include any frequency components supported by the bandwidth of the transmission line, and is not limited to RF signals. Furthermore, in alternative embodiments, the "transmission line" may be any two or more conductors suitable for supporting a signal that comprises an electrical voltage, either time-varying or DC. For example, in some embodiments, one or more shielded conductive paths through the transmission line may be employed for the delivery of power, such as AC and/or DC power.

Figure 2:
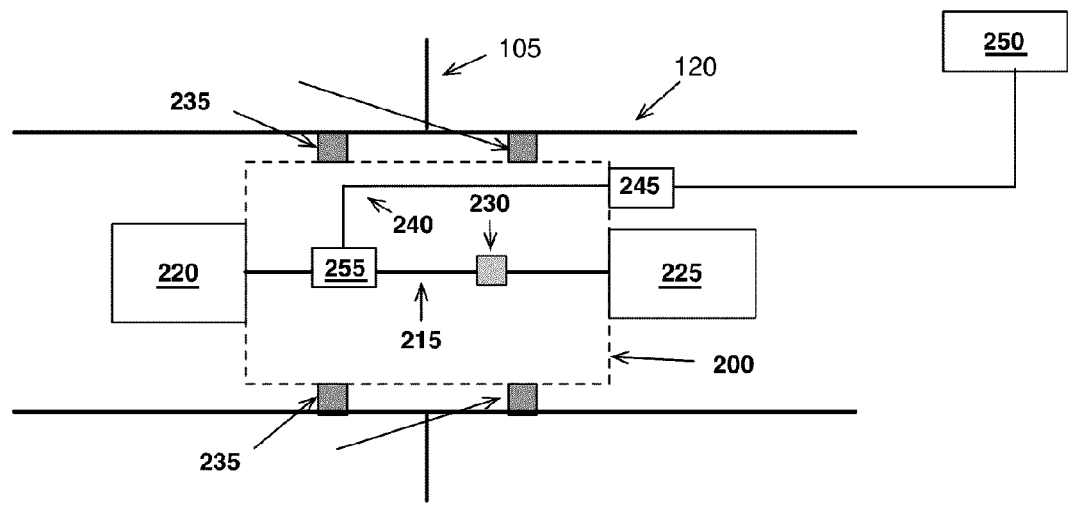
FIG. 2 is a schematic drawing of an example waveguide insert that contains an active device and is powered by an external power supply.

For example, as noted in reference to FIG. 1I, one or more active components may be provided within, or connected to, the waveguide insert. Some additional examples of possible active components include, but are not limited to: digital signal processors, microprocessors, TR switches, analog to digital converters, and digital to analog converters. With reference to FIG. 2, for the purposes of providing power to any active component 255 in the waveguide insert, a conductor such as a wire 240 can be placed inside the waveguide to supply power from a power supply 250 via a connector 245 located at one end of the waveguide. It should be noted that conductor 240 does not need to make electrical contact with the conducting insert as it does not extend through the entire length of the waveguide. While the presence of the conductor 240 can permit electromagnetic energy to travel through the portion of the waveguide in a TEM mode, where conductor 240 is present, it will be unable to travel past the active device 255 past the connection point of the conductor where only TM or TE modes can exist. In the situation where conductor 240 consists of a shielded conductor, the shield of the conductor could make electrical contact with waveguide insert.

Figure 3:
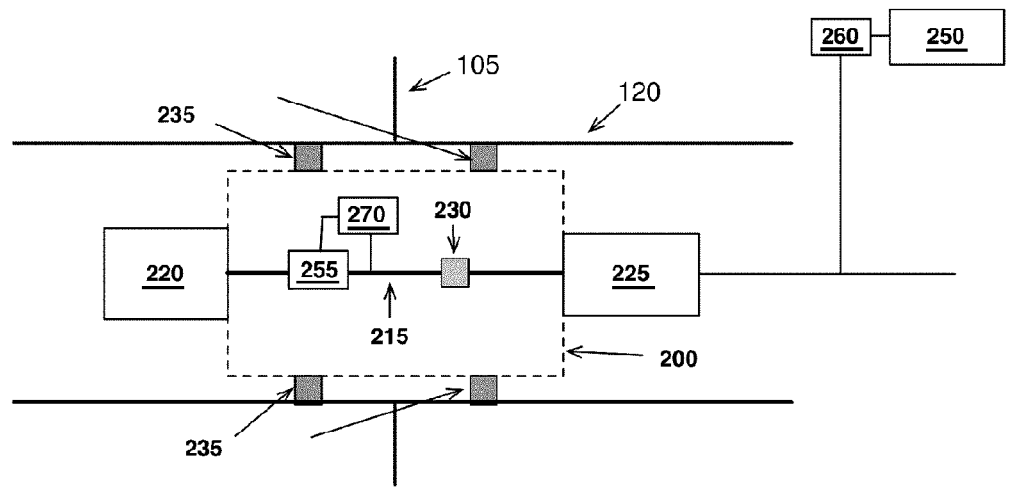
FIG. 3 is a schematic drawing of another example waveguide insert that contains an active device and is powered by an external power supply, where the power is provided via a bias T.

Alternatively, with reference to FIG. 3, power can also be supplied to the active component 255 via the transmission line 215 through the use of bias tees 260, one located outside the waveguide to couple DC power onto the transmission line, and another bias tee 270 located inside the waveguide insert to couple DC power to the active component.

Although FIGS. 1A-K, and FIGS. 2 and 3 illustrate example embodiments with a single electrical transmission path, it is to be understood that other embodiments may include multiple transmission paths (or transmission lines) that are provided with or otherwise supported by a waveguide insert. For example, with reference to FIGS. 4A and 4B, an example implementation of a multi-channel waveguide insert is provided. The example waveguide insert is illustrated as a removable cylindrical insert 200 that, when inserted into a waveguide port 120, makes electrical contact with the inside wall of the waveguide port, and is thereby brought to the same potential as Faraday cage 105.

Figure 4A:
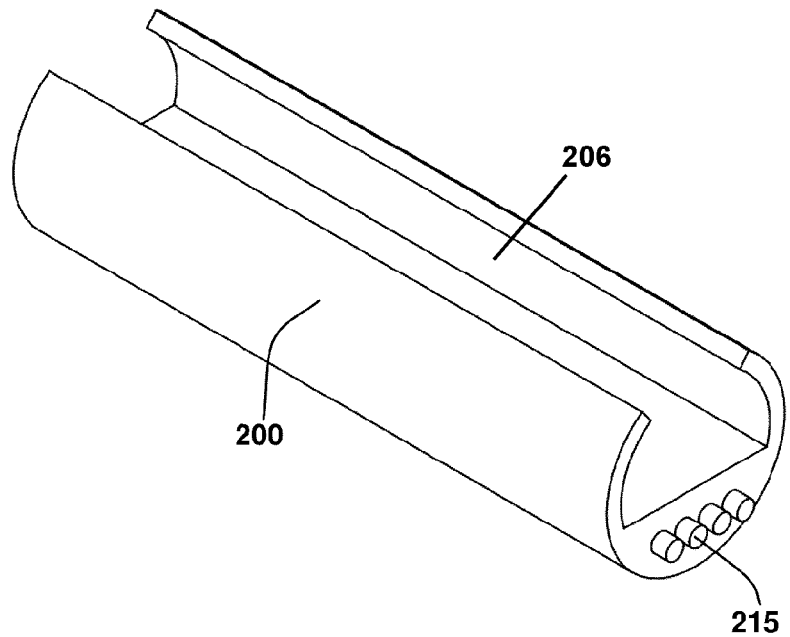
FIG. 4A is a perspective drawing of an example waveguide insert containing multiple transmission lines, antennas, connectors and electrical contacts to the waveguide insert.
Figure 4B:
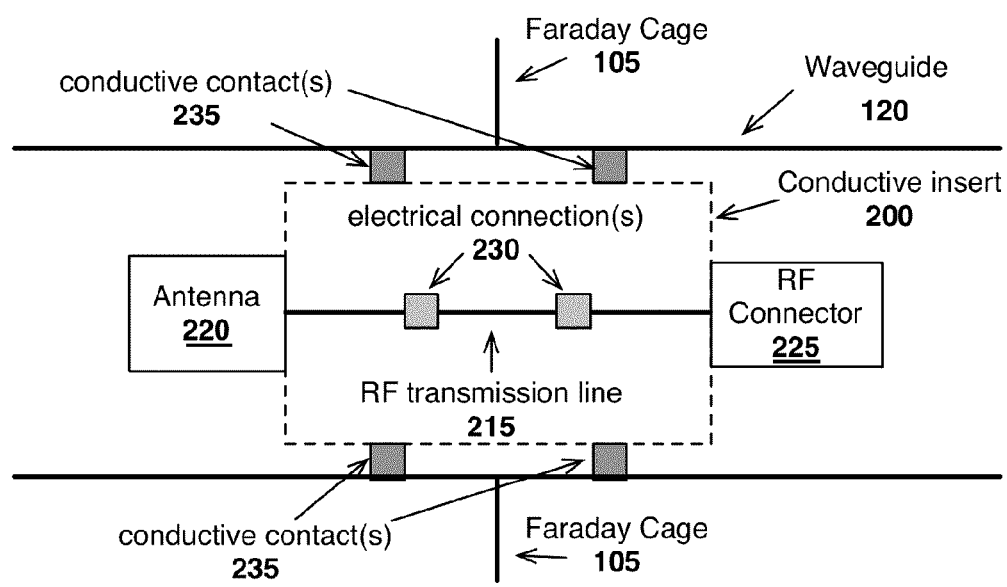
FIG. 4B is a schematic drawing of an example waveguide insert, schematically showing the electrical connections made between the outer conductor and the waveguide port.

As shown in the Figure (FIG. 4B shows one transmission line in order to simplify the illustration), multiple coaxial cable transmission lines 215 are located in the waveguide insert 200 and are connected to an antenna 220 located at one side of the insert, and are also connected to an electrical connector 225 located at the other end of the insert. Electrical contact is made between the shield conductor of the coaxial cables and conducting waveguide insert 200. The electrical connection can be made along the entire length of waveguide insert 200, or at one or more discrete locations, as shown schematically at 230. Electrical contact 235 between the waveguide insert and the inside surface of the waveguide may be established, for example, through the use of electrical magnetic interference (EMI) fingers or foam that maintain contact with the waveguide and one or more locations.

As noted above, the purpose of such electrical connections (230 and 235) is to ensure that the outside shields of the coaxial cables are kept at the same electrical potential as waveguide port 120, and by association, Faraday cage 105. By making electrical contact between the shields of the transmission lines and inner surface of the waveguide port through the waveguide insert, ambient RF energy that is present in the control room that is within the operating bandwidth of the MR scanner is unable to propagate along the outside shield of the coaxial cables and degrade image quality.

As can be seen in FIG. 4A, waveguide insert 200 can be inserted into the waveguide port, making contact with the waveguide port in a manner that supports rapid and convenient removal. In addition to containing transmission line 215, antenna 220, and electrical connector 225, waveguide insert 200 also contains an open, continuous channel 206 that can be used to pass non-metallic materials from the control room into the scanner room.

Figure 5:
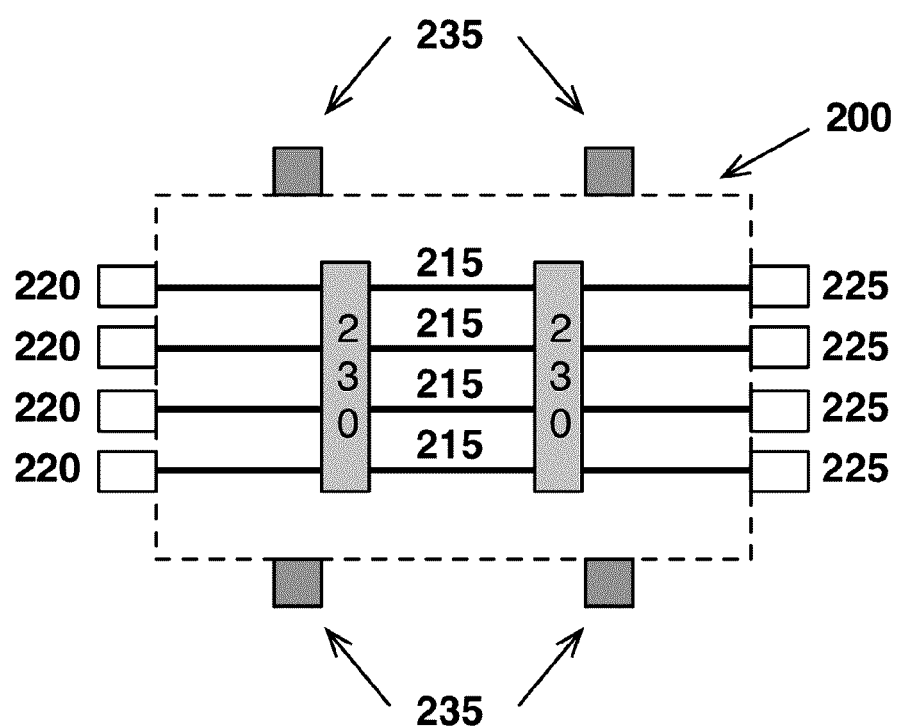
FIG. 5 is a schematic drawing of an example waveguide insert that contains multiple transmission lines.

For the purposes of transmitting and receiving multiple RF signals into and out of the Faraday cage, FIG. 5 shows a schematic drawing of an embodiment of the waveguide insert that contains multiple transmission lines 215, antennas 220, and connectors 225.

While it is a standard feature of a Faraday cage that is enclosing an MR imaging room to include a waveguide to allow the passage of non-conductive materials (such as anaesthesia tubes) from the outside of said room to the inside of said room, and vice versa, the physical properties of the waveguide may vary between manufacturers as well as individual sites. Examples of such variations include: (1) the orientation of the waveguide such as characterized by the angle between the longitudinal axis of the waveguide and its containing wall of the Faraday cage, and the angle between the longitudinal axis of the waveguide and the supporting floor of the Faraday cage; and, (2) the dimensions of the waveguide such as its diameter and length. It is to be understood that a waveguide insert may be provided to be compatible with such variations without departing from the scope of the present disclosure.

In some embodiments, the waveguide port may have one or more devices (such as anaesthesia tubes), conduits, or other structures traversing the length of the waveguide prior to the installation of a removable waveguide insert according the present disclosure. In such cases, due to the open channel that is provided in the waveguide insert, the waveguide insert may be installed without removing the pre-existing contents of the waveguide port.

Figure 6A:
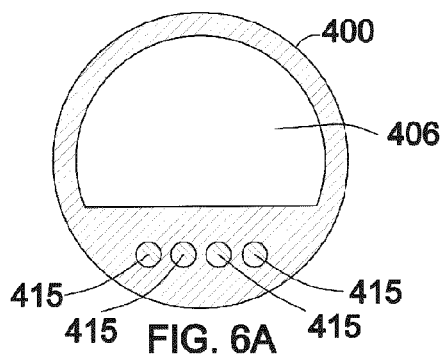
FIG. 6A-6F are a series of cross-sectional and longitudinal drawings demonstrating example embodiments of waveguide inserts with different body housings for the waveguide insert that produce different ways of inserting said insert into a waveguide.
Figure 6B:
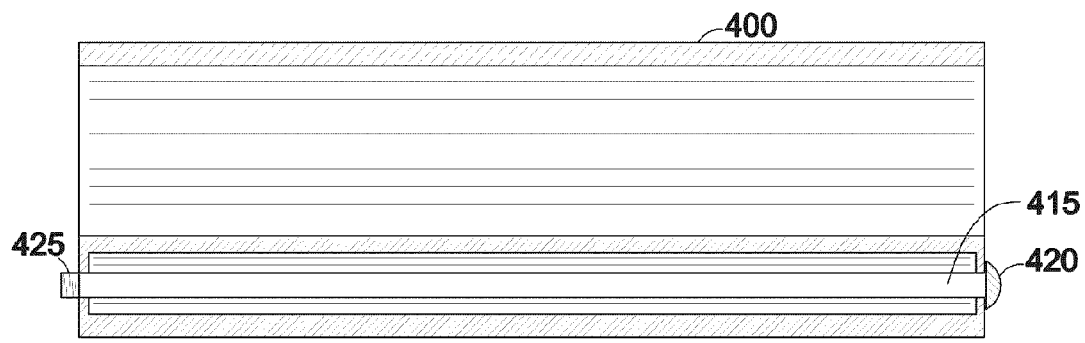

Referring now to FIG. 6A, a cross-sectional view of an example waveguide insert is shown with an enclosed cylindrical housing 400 that has a flat platform separating the waveguide insert cavity 406 from the transmission line components 415 of said insert. FIG. 6B shows the corresponding longitudinal cut-out view of FIG. 6A and depicts electrical connectors 425 terminating the transmission lines 415 on one end of the waveguide insert for interface with wired devices, and dome-shaped RF antennas 420 terminating the transmission lines 415 on the other end of said insert for interface with wireless devices.

Figure 6C:
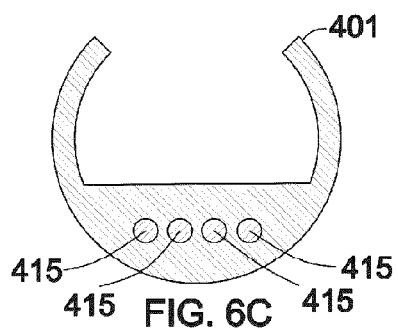
Figure 6D:
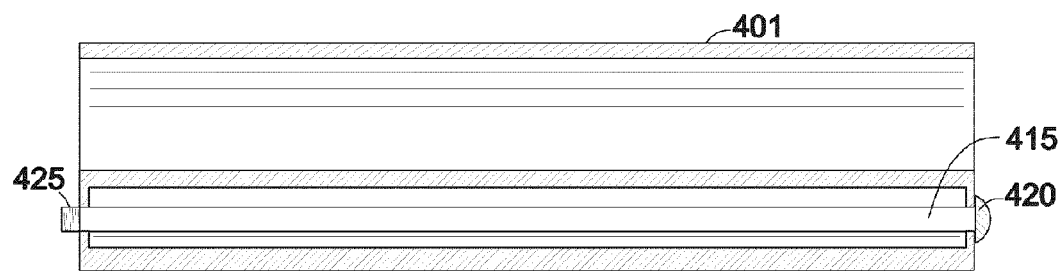

FIG. 6C shows a cross-sectional view of an example waveguide insert with a cylindrical housing 401 that has a cutout section at the top to enable the waveguide insert to be inserted into a waveguide that is already occupied by materials spanning the length of said waveguide. FIG. 6D shows the corresponding longitudinal cut-out view of FIG. 6C and depicts electrical connectors 425 terminating the transmission lines 415 on one end of the waveguide insert for interface with wired devices, and dome-shaped RF antennas 420 terminating the transmission lines 415 on the other end of said insert for interface with wireless devices.

Figure 6E:
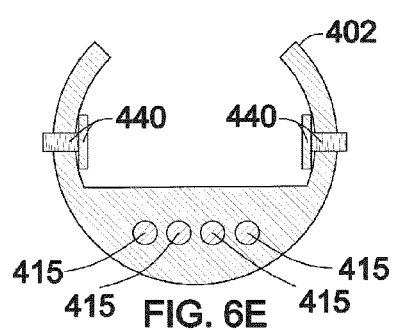
Figure 6F:
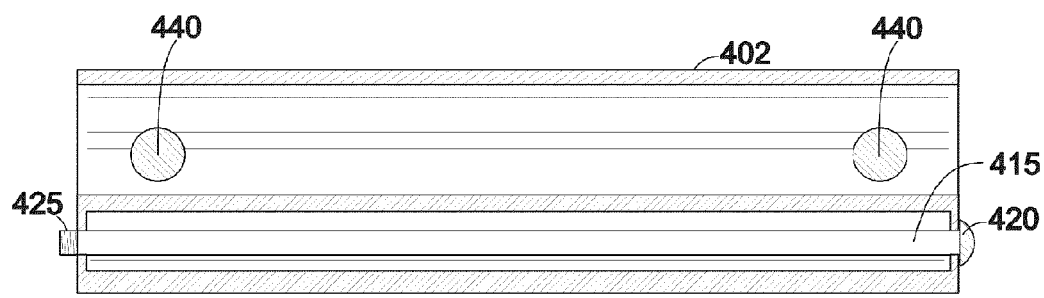

FIG. 6E shows a cross-sectional view illustrating an example waveguide insert where the waveguide insert is supported within the waveguide port by frictional forces established by four contact bolts 440, which are conductive, screwed through the wall of the waveguide insert housing 402 and contacting the waveguide. The contact points are shown in the example as blunt tips. FIG. 6F shows a longitudinal cut-out view of FIG. 6E and depicts electrical connectors 425 terminating the transmission lines 415 on one end of the waveguide insert for interface with wired devices, and dome-shaped RF antennas 420 terminating the transmission lines 415 on the other end of said insert for interface with wireless devices.

Figure 6G:
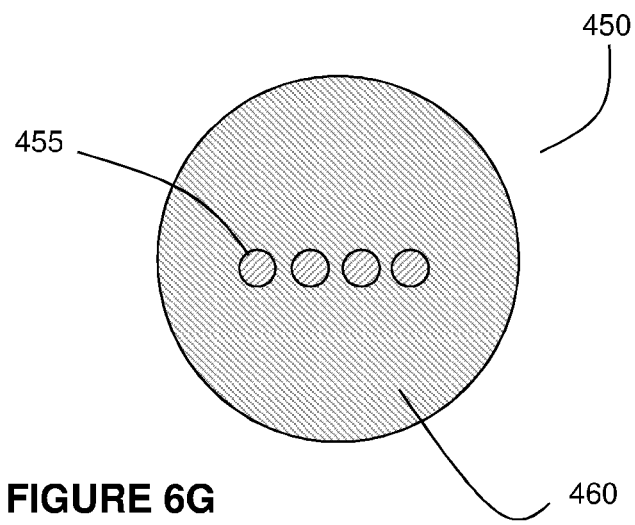
FIGS. 6G-6H are illustrations of an example non-waveguide insert that is insertable within an aperture or opening in a Faraday cage.
Figure 6H:
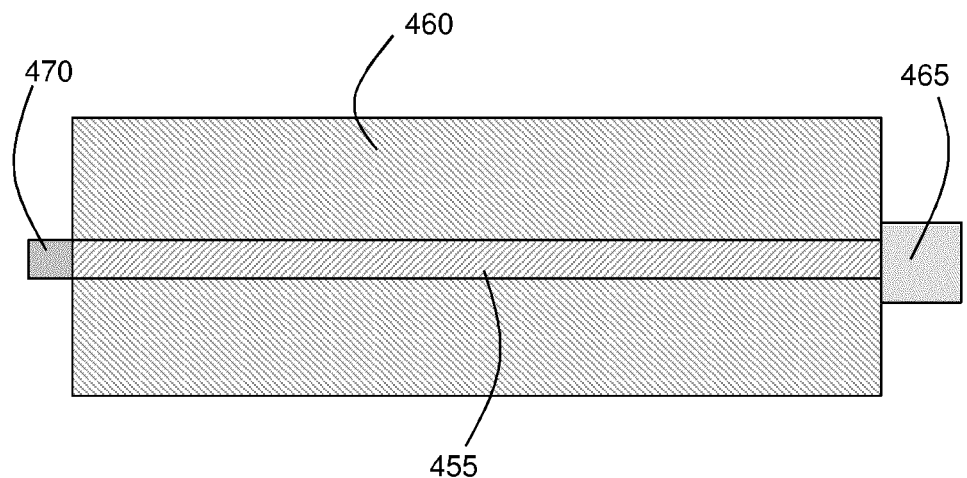

Referring now to FIG. 6G and FIG. 6H, an alternative embodiment is provided for transmitting a signal across a Faraday cage using a non-waveguide conductive insert 450. Non-waveguide insert 450 includes conductive body 460 and one or more transmission lines housed within conductive body 460, such that an outer shielding conductor of each transmission line is in electrical communication with conductive body 460. Although insert 450 is shown as having a longitudinal body, it is to be understood that non-waveguide insert need not have a longitudinal shape or extent, as the operation of non-waveguide insert is facilitated merely by the blocking of RF waves from passing through the hole, aperture, or waveguide formed in the Faraday cage. In some embodiments, when not in use, the hole or aperture may be blocked by a conductive object, such as a metal sheet or other suitable conductive enclosure.

In one embodiment, an antenna 465 may be connected to each transmission line, with a connector 470, or alternatively, another antenna, provided on the opposing side. This embodiment provides a useful device for rapidly and conveniently facilitating wireless communications within a Faraday cage, such that the communications signal may be transmitted through the Faraday cage via transmission line 455.

Unlike the preceding embodiments, non-waveguide insert 450 is configured to be provided in any opening of a Faraday cage, such that the opening is fully occupied by the presence of non-waveguide insert 450, and such that non-waveguide insert makes electrical contact with the Faraday cage. For example, non-waveguide insert can be inserted through a non-waveguiding (leaky) hole or aperture in a Faraday cage, such that the presence of non-waveguiding insert 450 substantially fills the hole or aperture and thus substantially prohibits the leakage of RF waves through the hole or aperture. In another embodiment, non-waveguide insert 450 may be inserted within a waveguide port within a Faraday cage, substantially filling the waveguide port over at least a portion of its length, such that the transmission of RF waves through the waveguide port is substantially prohibited.

Figure 7A:
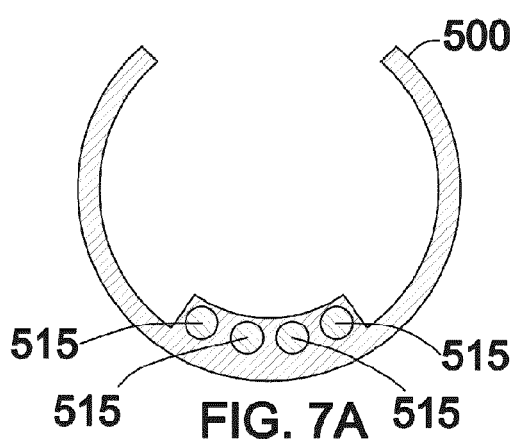
FIG. 7A-7F are a series of drawings demonstrating example embodiments with different component configurations for the waveguide insert to vary the amount of obstruction to the waveguide cavity.
Figure 7B:
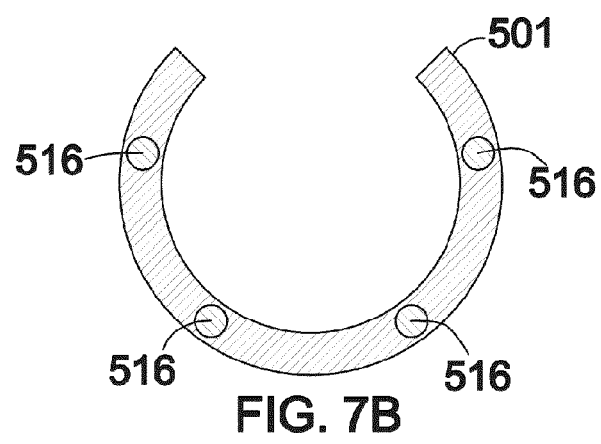

FIGS. 7A and 7B demonstrate, in a series of cross-sectional views, embodiments of the waveguide insert where the amount of obstruction to the cavity of the waveguide is varied. In FIG. 7A, an example waveguide insert is shown with the transmission cable components 515 distributed near the bottom of the insert in a semi-circular pattern, and where the conductor housing 500 of the waveguide insert is made thinner than previously shown embodiments. FIG. 7B shows an example waveguide insert with the transmission cable components 516 distributed along a circle inside of the conductor housing 501 of the waveguide insert.

It should be understood that while maintaining an elongate cavity in the waveguide insert may be beneficial in that it preserves the physical function of the waveguide port, in some embodiments, there may be no such open channel. For example, in one embodiment, the waveguide insert housing may be solid without an inner cavity or conduit.

In the embodiments shown in FIGS. 4A, 6A, 6C, 6E, 7A, and 7B, the cross-section of the waveguide insert is provided with an upper portion having a shape that extends beyond the lower semicircular half of the waveguide port. By extending the waveguide insert in such a manner, frictional engagement between the outer walls of the waveguide insert and the inner walls of the waveguide port can be obtained. In contrast, the cross-sectional embodiment of the waveguide insert shown in FIG. 1C does not extend above the lower semicircular half of the waveguide port, and contact upon insertion is provided due to the weight of the waveguide insert alone. Embodiments in which the lateral portions of the waveguide are extended to frictionally engage with the upper semicircular portion of the waveguide port may thus be advantageous in order to provide more secure and stable contact between the waveguide insert and the waveguide port. In some embodiments, conductive contacts that are compressible may be provided for providing a secure fit while maintaining electrical contact. Example compressible contacts include conductive foam or other compressible conductive materials, and conductive detent mechanisms, such as one or more spring-biased metal ball detent mechanisms.

Furthermore, it is to be understood that some embodiments of the present disclosure, such as the embodiment shown in FIGS. 6A and 6B, may alternatively be employed as a waveguide device that can be inserted through an opening in a Faraday cage for forming a waveguide port, where the waveguide port has transmission lines integrated therein (e.g. housed within a side wall of the waveguide). Such devices may be useful in retrofitting existing Faraday cages that do not initially include a waveguide. Other examples of such integrated devices include those illustrated in FIGS. 7A and 7B, provided that the conductive portion is modified to completely enclose the internal longitudinal open conduit.

Figure 7C:
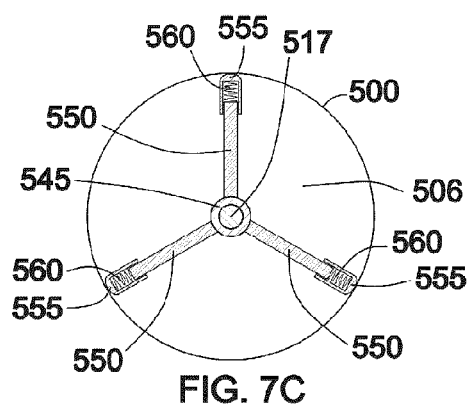

FIG. 7C demonstrates an embodiment where the waveguide insert takes on the form of a tripod structure with one hundred twenty degrees of separation between adjacent support legs 550. Each leg extends from a conductive ring 545 around the transmission line and is connected via a conductive spring 560 to its foot 555, which makes conductive contact with the waveguide port 500. The length and compressibility of the springs in the tripod structure are selected to provide adequate suspension of the transmission line as well as variability in span to fit the waveguide insert inside waveguides with a cross section that is smaller than the uncompressed span of the tripod structure.

Figure 7D:
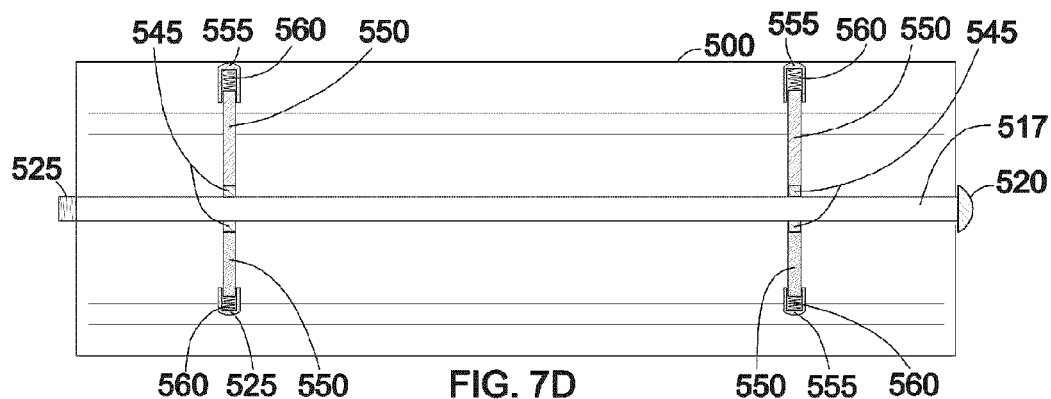

FIG. 7D shows a longitudinal cut-out view of FIG. 7C and depicts two of the tripod structures supporting the transmission line 517 along the waveguide 500 and maintaining electrical contact between the shield of the transmission line and the waveguide. FIG. 7D also depicts an electrical connector 525 terminating the transmission line 517 on one end of the waveguide insert for interface with wired devices, and a dome-shaped RF antenna 520 terminating the transmission line 517 on the other end of said insert for interface with wireless devices.

Figure 7E:
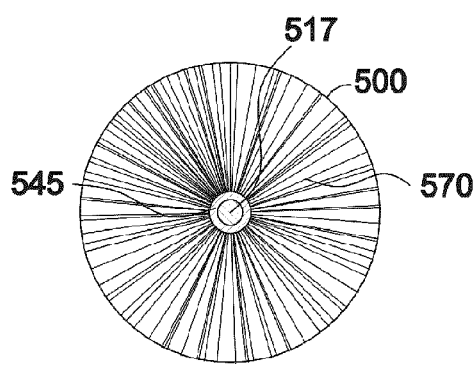

FIG. 7E demonstrates an embodiment where the waveguide insert takes on the form of a circular brush structure with flexible, conductive filaments 570 extending from a conductive ring 545 around the transmission line 517 shield to make contact with the waveguide 500. The physical properties of the filament may be selected to provide adequate support of the transmission line as well as flexibility to fit inside waveguides with a cross section that is smaller than the span of the filament brush. It is to be understood that the location of the transmission line within this filament brush does not need to be in the center of the waveguide, and can, for example, be at the bottom.

Figure 7F:
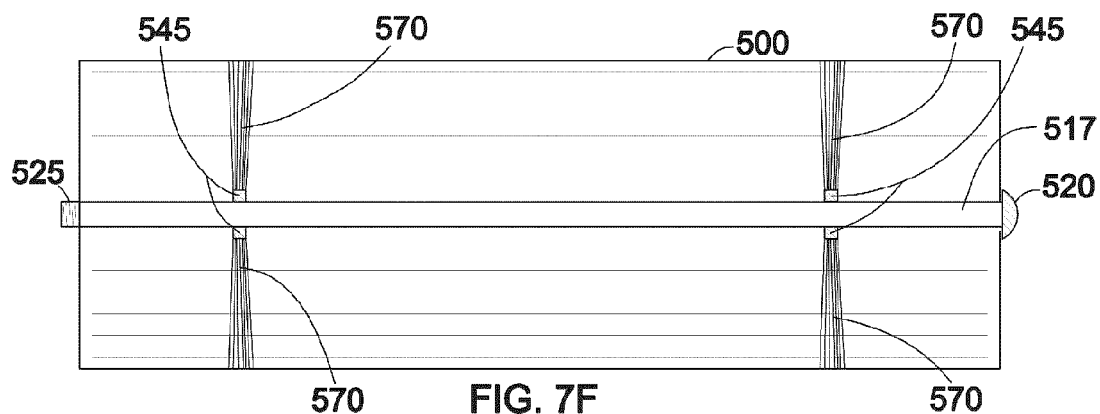

FIG. 7F shows a longitudinal cut-out view of FIG. 7E and depicts two of the brush structures supporting the transmission line 517 along the waveguide 500 and maintaining electrical contact between the shield of the transmission line 517 and the waveguide. FIG. 7F also depicts an electrical connector 525 terminating the transmission line 517 on one end of the waveguide insert for interface with wired devices, and a dome-shaped RF antenna 520 terminating the transmission line 517 on the other end of said insert for interface with wireless devices.

Figure 8:
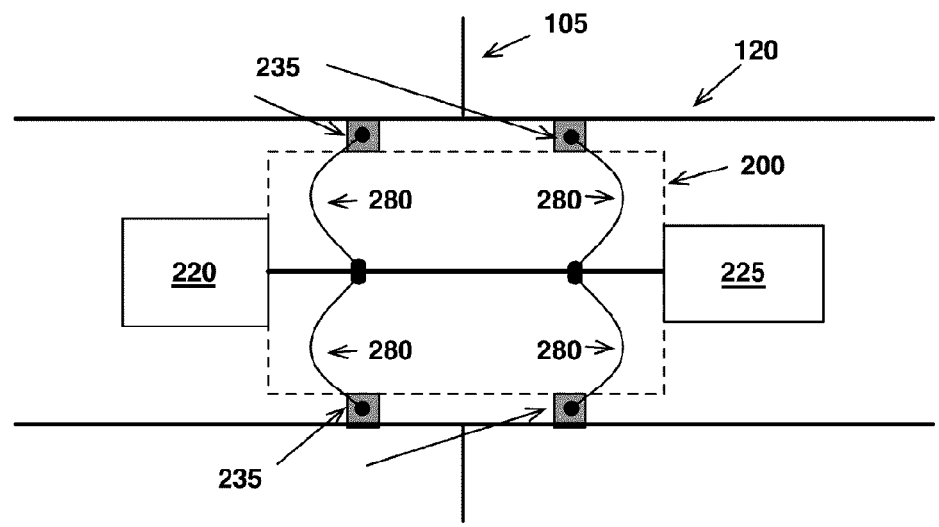
FIG. 8 is a schematic drawing of an example waveguide insert that is constructed out of non-conductive material, whereby electrical contact with the waveguide is provided by a length of conductive material.

FIG. 8 shows an embodiment where the outer shell of the waveguide insert is made of a non-conducting material such as plastic, acrylic, Teflon, thermoplastic, etc. In this embodiment, the shields of the transmission lines do not make direct electrical contact with the outer shell of the waveguide but make electrical contact with contacts on the outside of the waveguide shell through one or more lengths of conducting material 280.

Figure 9:
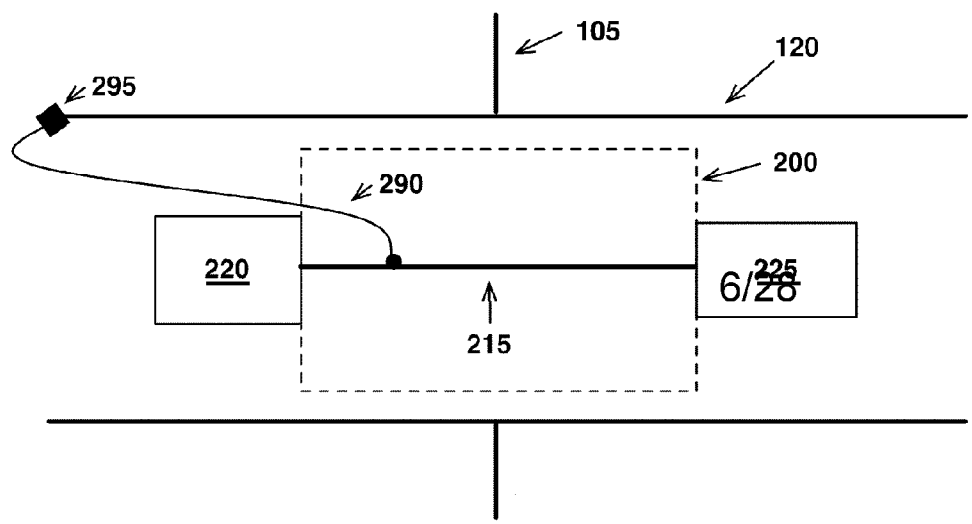
FIG. 9 is a schematic drawing of an example waveguide insert whereby electrical contact between a transmission line and the waveguide is made via a length of conductive material and a connector.

As noted above, in certain situations, the conducting inside surface of the waveguide may not be accessible due to the presence of a non-conductive lining. FIG. 9 shows an embodiment where electrical contact is made between the shield of the transmission line(s) and the Faraday cage through the use of a length of conductive material such as a wire 282 and a connector 284 which makes electrical contact with and exposed conducting section of the waveguide. Examples of connectors that could be used are a conductive clip, magnet, or frictional contact. As noted above, the length of conductive material should be sufficiently short to establish an equipotential connection for maintaining the properties of the waveguide and prohibit TEM waves from propagating.

Figure 10:
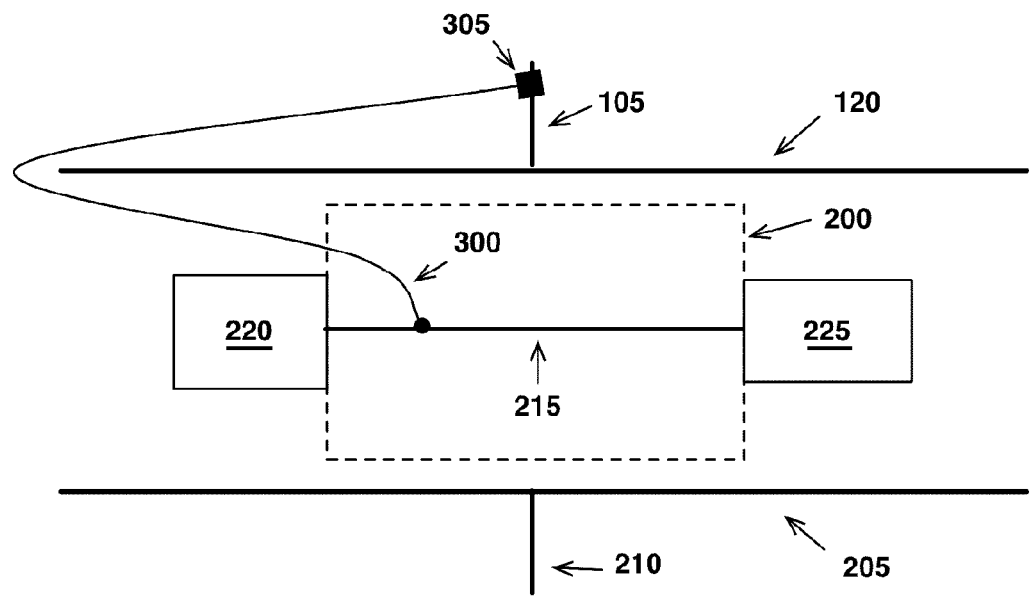
FIG. 10 is a schematic drawing of an example waveguide insert whereby electrical contact between a transmission line and the Faraday Cage is made via a length of conductive material and a connector.

For the purposes of making electrical contact to the Faraday cage when it is not possible to make electrical contact to a conducting surface of the waveguide in situations where a non-conducting insulation prevents access, FIG. 10 shows an embodiment where electrical contact is made electrical contact between the shield of the transmission line(s) and the Faraday cage through the use of a length of conductive material such as a wire 286 and a connector 288 which makes electrical contact with the Faraday cage at one or more locations close to the waveguide. Examples of connectors that could be used are a conductive clip, magnet, or frictional contact. As noted above, the length of conductive material should be sufficiently short to establish an equipotential connection for maintaining the properties of the waveguide and prohibit TEM waves from propagating.

Figure 11:
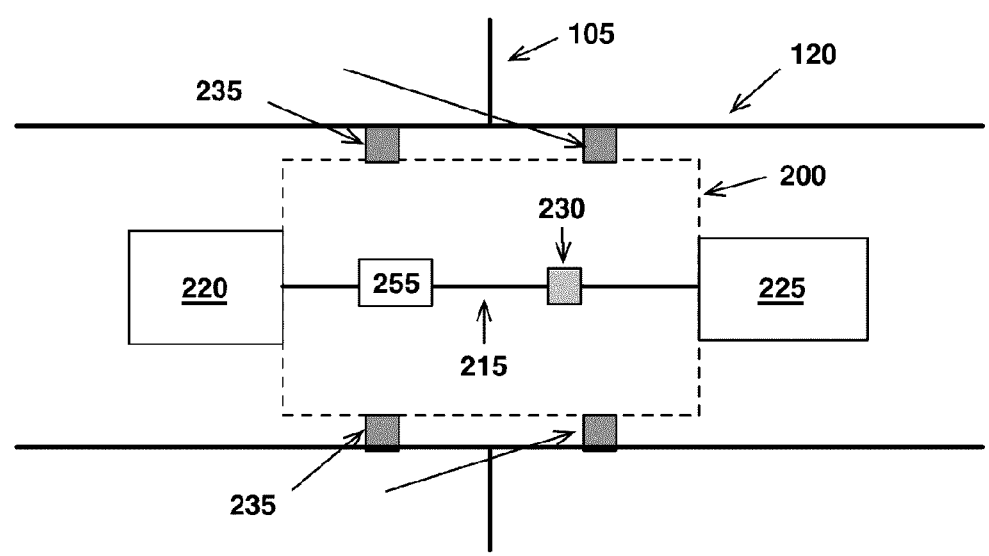
FIG. 11 is a perspective drawing of an example waveguide insert that contains electronic components in line with transmission lines.

For the purposes of conditioning or amplifying the RF signals on the transmission lines, electronic components can be placed in line with the transmission lines inside the waveguide insert. FIG. 11 shows an embodiment where a coaxial filter 255 is placed in line to remove any frequency component of the RF signals within the bandwidth of the MR scanner. As noted above, other examples of electronics that could be placed in line with the transmission line include active components such as amplifiers, or discrete components such as capacitors, inductors, or resistors.

Figure 12A:
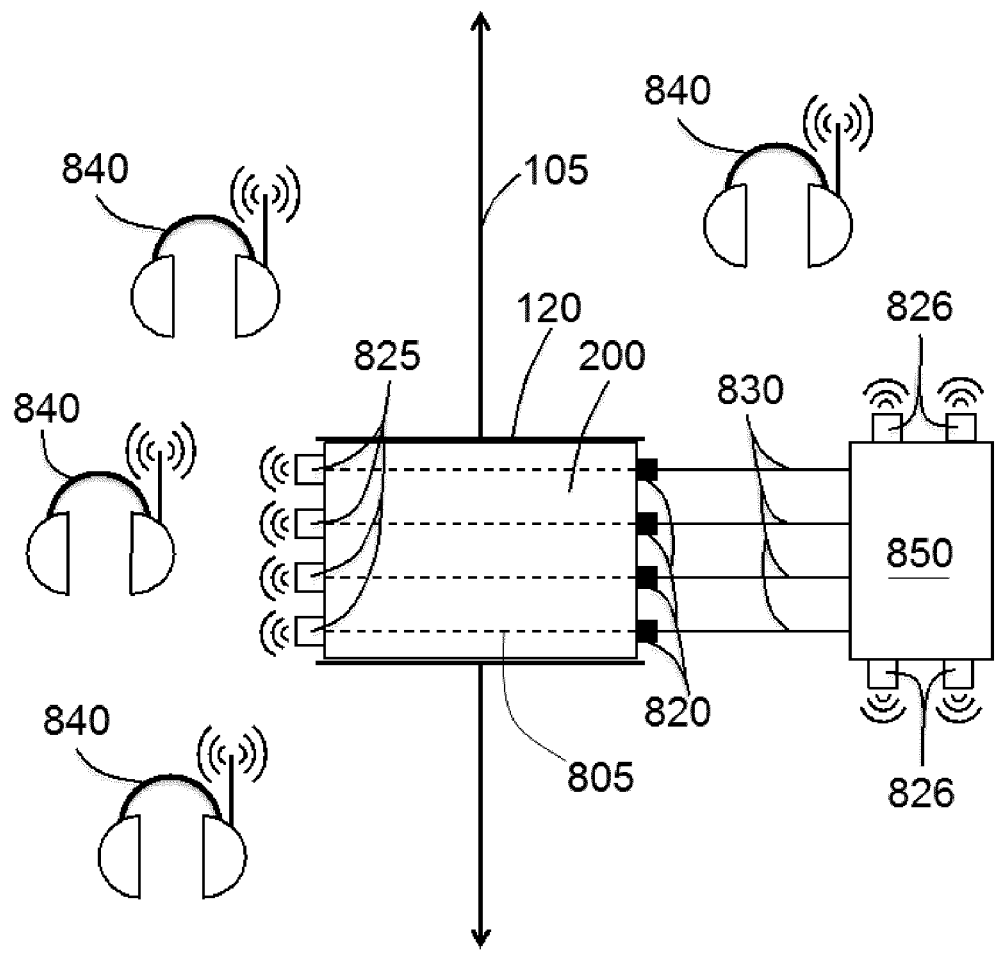
FIG. 12A is a schematic illustrating an example wireless audio communication system.

The preceding embodiments may be employed as components of a wireless communication system that is configured to support wireless communications among users residing within, and/or outside of, a Faraday cage. FIG. 12A is a schematic drawing that illustrates an example implementation involving the use of the waveguide insert as part of a wireless audio communication system. In this example system, waveguide insert 200 comprises, as illustrated for the example case of N=4: N transmission lines 805 and N corresponding antennas 825 terminating said transmission lines inside the Faraday cage for interface with wireless headsets 840 inside said Faraday cage. Waveguide insert 200 is connected to communications controller 850 through cables 830.

Although the example embodiment illustrates the connection of controller 850 to waveguide insert 200 through cables 830, it is to be understood that such a connection configuration is intended to be illustrative of one example implementation for connecting waveguide insert 200 to communications controller 850. For example, as shown in the Figure, cables 830 may be connected to waveguide insert 200 through connectors 820, or, alternatively, cables may be hardwired to waveguide insert 200. In another example embodiment, communications controller 850 may be physically mounted to waveguide insert 200, such that that controller 850 resides adjacent to the Faraday cage. In yet another example embodiment, communications controller 850 may transmit signals to waveguide insert 820 through a plurality of additional antenna provided in place of connectors 820.

Figure 12B:
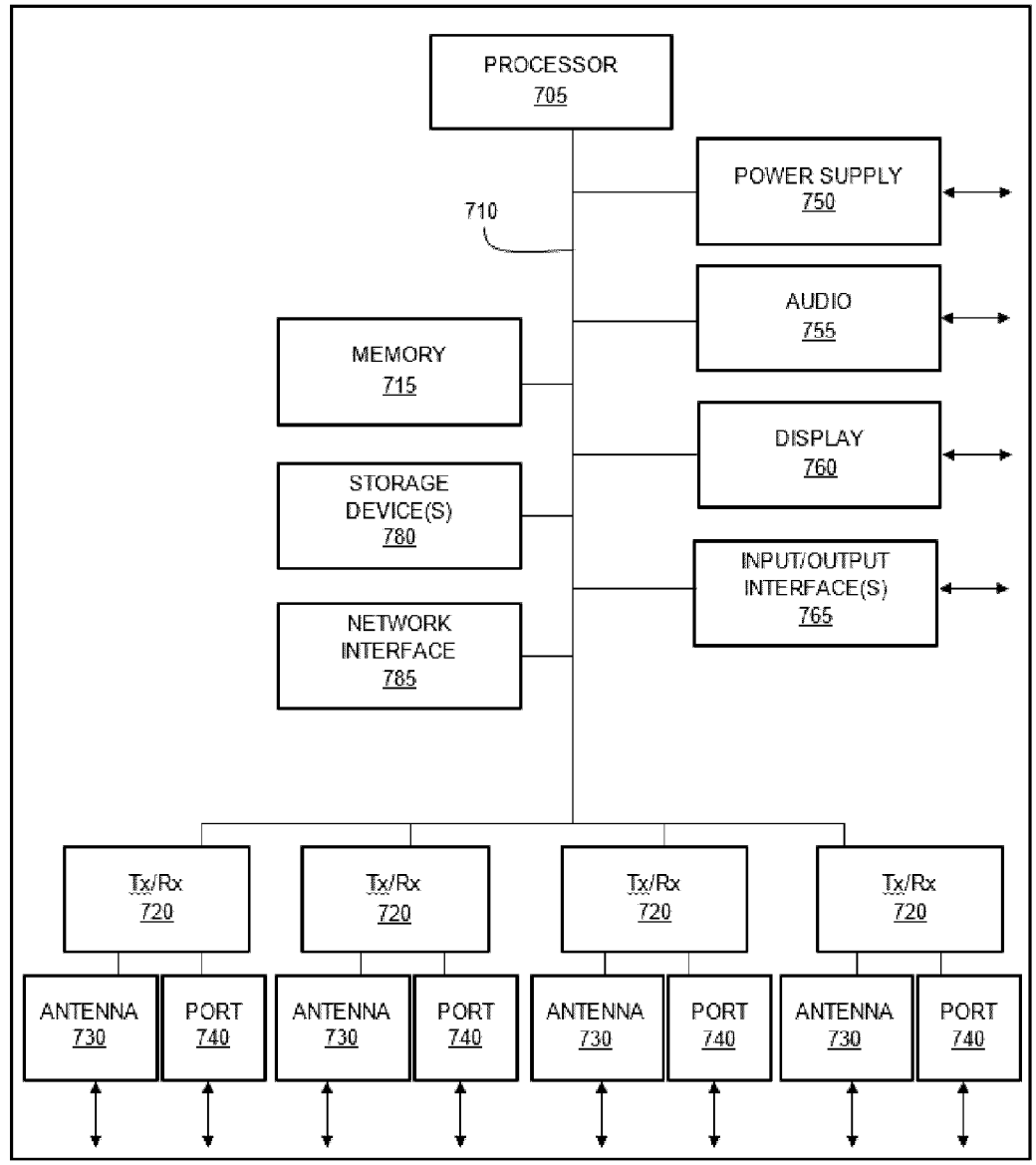
FIG. 12B is a block diagram of an example communications controller.

FIG. 12B illustrates an example implementation of communications controller 850, which includes one or more processors 705 (for example, a CPU/microprocessor), bus 710, memory 715, which may include random access memory (RAM)and/or read only memory (ROM), power supply 750, and transceivers 720 (example transceivers are described in further detail below). Transceivers 720 may operate at different frequencies to support multiplexed communication. As shown in the Figure, communications controller 850 may include antenna 730 and/or wired ports 740 for transmitting electrical communications signals to other electronic communication devices present in the system. As noted above, although the example system is illustrated as including four communications channels, it is to be understood that the number of communications channels is not limited to four.

Communications controller may further include, or may be interfaced with, user input and/or output devices, such as an audio device 755, which may be employed for providing audio broadcast of all active audio channels within the room in which communications controller 850 resides. Communications controller 850 may further include display 760 (which may be a touch screen display for displaying information on a user-interface, as well as collecting user input for the control of the wireless audio communication system), and various input/output devices and/or interfaces 765 (e.g., a receiver, a transmitter, a speaker, a display, an imaging sensor, such as those used in a digital still camera or digital video camera, a clock, an output port, a user input device, such as a keyboard, a keypad, a mouse, a position tracked stylus, a position tracked probe, a foot switch, and/or a microphone for capturing speech commands).

Communications controller 850 may also include one or more optional internal storage devices 780 (e.g. a hard disk drive, compact disk drive or internal flash memory), and 785 network interface, for example, for communicating with other non-audio peripheral electronic devices, either via a wired or wireless communication channel.

Although bus 710 is depicted as a single connection between all of the components, it will be appreciated that the bus 710 may represent one or more circuits, devices or communication channels which link two or more of the components. For example, in personal computers, bus 710 often includes or is a motherboard.

In one embodiment, communications controller 850 may be, or include, a general purpose computer or any other hardware equivalents. Communications controller 850 may also be implemented as one or more physical devices that are coupled to processor 705 through one of more communications channels or interfaces. For example, communications controller 850 can be implemented using application specific integrated circuits (ASICs). Alternatively, communications controller 850 can be implemented as a combination of hardware and software, where the software is loaded into the processor from the memory or over a network connection.

Communications controller 850 may be programmed with a set of instructions which when executed in the processor causes the system to perform one or more methods described in the present disclosure. Communications controller 850 may include many more or less components than those shown.

While some embodiments have been described in the context of fully functioning computers and computer systems, those skilled in the art will appreciate that various embodiments are capable of being distributed as a program product in a variety of forms and are capable of being applied regardless of the particular type of machine or computer readable media used to actually effect the distribution.

A computer readable medium can be used to store software and data which when executed by a data processing system causes the system to perform various methods. The executable software and data can be stored in various places including for example ROM, volatile RAM, non-volatile memory and/or cache. Portions of this software and/or data can be stored in any one of these storage devices. In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs),digital versatile disks (DVDs), etc.), among others. The instructions can be embodied in digital and analog communication links for electrical, optical, acoustical or other forms of propagated signals, such as carrier waves, infrared signals, digital signals, and the like.

Referring again to FIG. 12A, the example audio communication system comprises N headsets, each associated with a dedicated transmission line inside waveguide insert 200, and each being able to wirelessly transmit and receive audio signals to and from other headsets in the system while being inside or outside of said Faraday cage, where the control of the signal routing is performed by communications controller 850.

An example of implementation of the headset 840 will now be described. It is desirable for the headset to operate safely within the magnetic field of the MR scanner. Therefore, the materials forming headset 840 are non-ferromagnetic. In particular, headset 840 does not use conventional magnetic speakers, nor magnetic microphones; instead, it uses piezoelectric speakers and piezoelectric contact microphones.

Figure 12C:
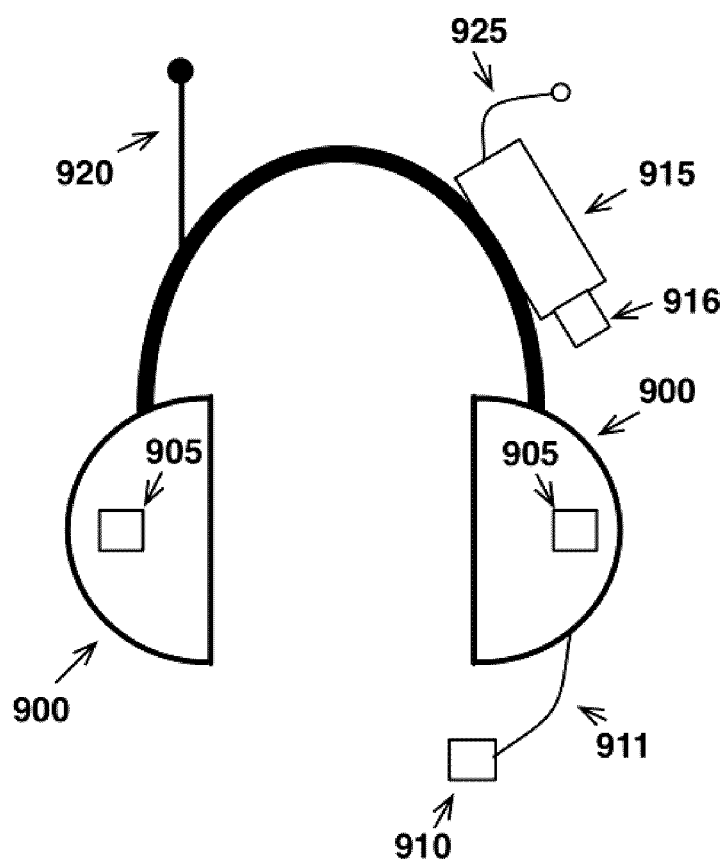
FIG. 12C is an illustration of an example wireless headset.

FIG. 12C is an illustration showing the components of example headset 840, which includes: at least one noise protection cavity 900 which fit over each ear of the user, at least one piezoelectric speaker 905 located inside one or each of the protection cavities for outputting audio signals to the user; at least one piezoelectric contact microphone 910 for receiving audio input signals from the user; and, headset control circuit 915 (including but not limited to at least one microprocessor); at least one conductor 911 connecting contact microphone 910 to the electronic components, at least one battery 916, at least one antenna 920. Headset 940 may include an electrical cable 925 for programming and facilitating the operation of the previously described components of headset 940.

It is desirable for headset microphone 910 to accept user vocal input, but reduce the audio input of ambient MR gradient noise. The present disclosure provides a headset microphone that achieves this goal via two characteristics:

(1) microphone 910 uses a throat-conduction piezoelectric transducer to detect vocal input directly from the vibrations of the user's throat, while being insensitive to ambient air vibrations such as that caused by MR gradients or generic background noise; and, (2) voice activity detection (VAD) is employed for filtering out MR gradient noise in the absence of user speech. The microphone is held on the user's neck by a neck band.

An example voice activity detection method for controlling an audio recording device in the presence of MR gradient noise is described in the following cases: (1) When the conduction microphone detects no voice and no ambient gradient noise, the VAD remains untriggered and there is no audio transmission; (2) when the microphone detects voice and/or ambient gradient noise, the VAD triggers and there is audio passthrough; and, (3) when the microphone detects only ambient gradient noise, the VAD does not trigger and there is no audio transmission.

In one embodiment, VAD may be implemented by exploiting the frequency patterns of the expected audio input, which is now briefly described. MR gradient noise is essentially the linear combination of a narrowband signal (at a fundamental frequency, $f_0$) and its harmonics (at frequencies that are integer multiples of $f_0$). For audio communications, the MRI gradient noise concerns with harmonics within the human auditory bandwidth, which is approximately 1 Hz to 20 kHz. $f_0$ is determined by the reciprocal of the repetition time ($T_R$) (e.g. the repetition rate) of a particular MR imaging sequence, and in practice, due to hardware constraints, $T_R$ is rarely shorter than 3 milliseconds, meaning $f_0$ is rarely higher than 333 Hz. Therefore, MR gradient noise above 333 Hz is very likely a harmonic, an integer multiple of some $f_0$. Lastly, the frequency bandwidth of human speech is approximately 1 Hz to 4 kHz.

In one example VAD method, the audio signal is interrogated to determine the presence or absence of significant signal amplitude (beyond an experimentally calibrated threshold) in one or more narrow pre-selected frequency bands, herein denoted "inspection bands," where a minimum of a single inspection band is used. The inspection bands are selected such that they are do not coincide with gradient noise, e.g. they are substantially free of gradient noise.

For example, in one example implementation, the center frequency of the one or more inspection bands is chosen such that it is unlikely to coincide with MR gradient noise harmonics; for example, prime numbers above 333 Hz may be employed. It may be beneficial to employ more than one inspection band because gradient noise is not ideal and has a narrow bandwidth. At the same time, too many bands may constrain the VAD to only accept a certain type of voice. In some embodiments, a plurality of inspection bands may be employed, where the center frequencies of the inspection bands are distributed across the human audible frequency range.

Figure 12D:
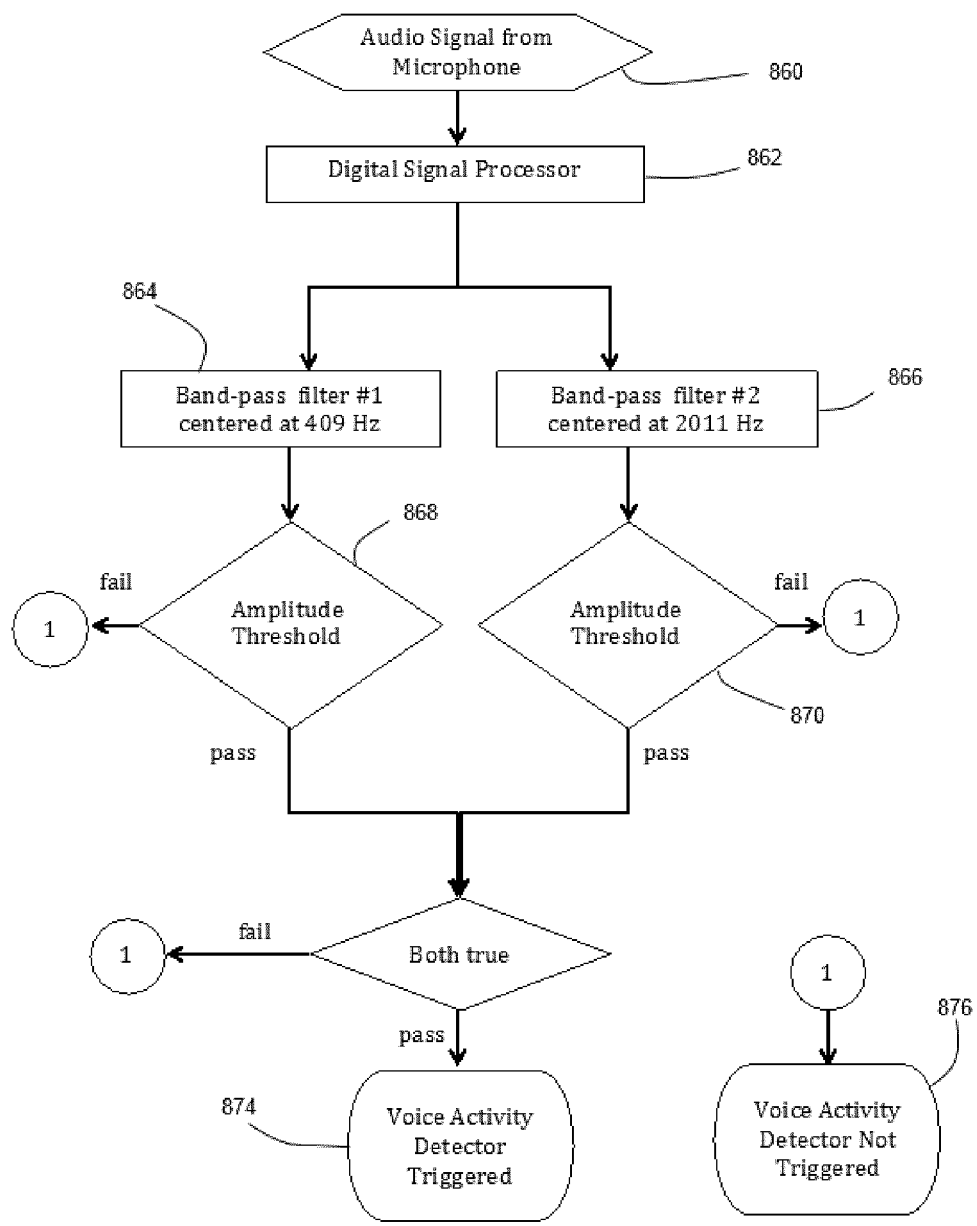
FIG. 12D is a flow chart illustrating an example method of voice activated detection.

FIG. 12D shows a flow diagram illustrating an example dual inspection band threshold algorithm of the VAD. In this process, the audio input signal 860, after being digitized by a digital signal processor 862 (i.e. processor 705, or a processor local to headset 840) is fed through two band-pass filters 864 and 866 at frequencies $f_1$=409 Hz and $f_2$=2011 Hz (prime number frequencies near the low and middle range of human speech). The amplitudes of the filtered outputs are then compared to a calibrated threshold, as shown at 868 and 870.

In one example implementation, if the amplitudes are both greater than the threshold, then the VAD is triggered, as shown at 872 and 874. On the other hand, if either one (or both) of the amplitude thresholds are not exceeded, then the voice activity detector is not triggered, as shown at 876.

In another example implementation, the voice activity detector may be triggered when only a single amplitude threshold is satisfied.

It is to be understood that the VAD methods disclosed herein, or variations thereof, may be performed remotely by communications controller 850, or may be performed locally by control circuit 915 provided on headset 840.

FIG. 12E shows an embodiment of the neck band which houses the throat-conduction microphone. The neck band comprises small segments 1000 approximately one inch long adjoined by torsion springs made of MR-compatible material such as nitinol, brass, non-ferrous stainless steel, titanium, or copper. Referring now to subsection 1 of FIG. 12E, a torsion spring 1010 is shown to be inside a neck band segment (in dotted outline and hatched) such that two adjacent segments rotate about an axle 1025 (shown in dotted outline and hatched) bringing the legs of the spring closer together. The axle is kept in place by end caps 1025. Referring now to subsection 2 of FIG. 12E, the last segment 1001 of the neck band comprises the throat-conduction microphone (for detecting audio signals from the body) housing 1040 such that the conduction surface 1005 contacts the skin of the throat. The series of torsion spring-hinged segments wrap the band around a user's neck, conforming its shape to the shape of the user's neck. FIG. 12F shows the assembly of three neck band segments 1000, straightened, and viewing from the outer, non-contact side of the neck band. Here, the straightened band forces the legs of the torsion springs 1010 to be one hundred eighty degrees apart from each other.

It is to be understood that the embodiment illustrated in FIG. 12E is but one example implementation of a band having a microphone integrated therewith, where the band is segmented in such a way that the pressure applied to the wearer's body (e.g. applied to an anatomical region of a wearer's body) is distributed along at least a portion of the length of the band. In some embodiments, the band is configured to distribute the pressure at a plurality of locations by incorporating connected segments. It is also to be understood that the segments may be connected using other mechanisms than the torsion spring illustrated in FIG. 12E. For example, a living hinge may be employed to apply the local force. For another example, elastic cords wrapped around an axle may be used to apply the local force.

In other alternative implementations, one or more of the band segments may be curved to provide a more ergonomic fit with the wearer's body (e.g. the band better conforms with a given anatomical region of a wearer's body). Furthermore, although the neck band illustrated in FIG. 12E shows a single microphone, alternative embodiments may include a second microphone. The second microphone may be provided, for example, in a segment that is at the end distal to subsection 2, or within any other segment 1000.

It is to be understood that the conduction microphone may contact the user in anatomical regions other than the throat while being sensitive to the user's voice. For example, the conduction microphone may be placed in various places on the user's skull, such as around the ear, e.g. behind the ear with the conduction surface flat against the mastoid process, and on the forehead.

It is to be understood that the wireless transmission and reception of signals within the audio communication system may use various frequencies of the RF spectrum. Common commercial implementations include Bluetooth and Wi-Fi.

Figure 13A:
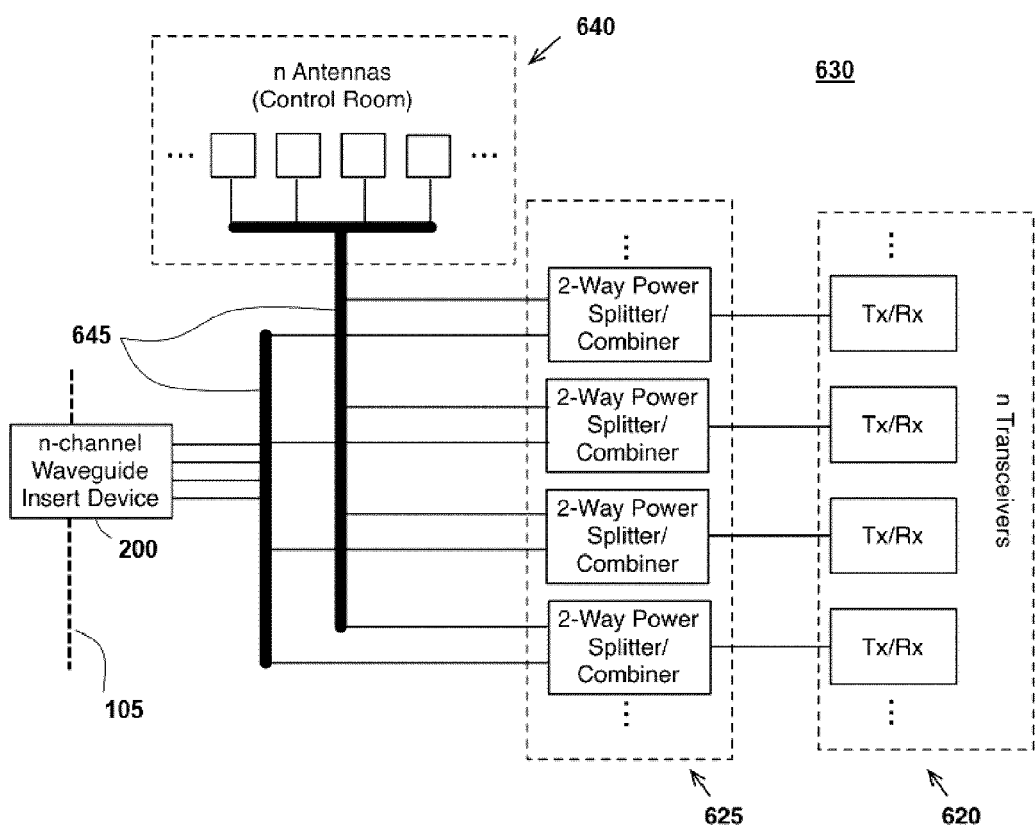
FIG. 13A is a schematic drawing illustrating the use of the multi-channel waveguide insert connected to several RF transceivers.

Referring now to FIG. 13A, an alternative system embodiment is illustrated in which the waveguide insert device is connected to electronics and controllers located in the control room including at least one RF transceiver 620. Each input/output of each transceiver 620 is connectable to the waveguide insert device 200 through a 2-way power splitter/combiner 625. The splitter/combiner 625 splits any wireless signal transmitted from transceiver 620 and feeds a portion (e.g. half) of its power into waveguide insert 630 for wireless transmission within the Faraday cage 105 (e.g. in an MR suite) and feeds another portion of its power to antenna (s) 640 located in the control room 630 for wireless transmission in the control room. Conversely, this configuration would also enable the transceiver to receive wireless signals originating from both the MR suite and from the control room. Thick bars 645 represent a bus of the 4 signal paths, such that a dedicated signal path is provided between each transmitter/receiver pair.

Figure 13B:
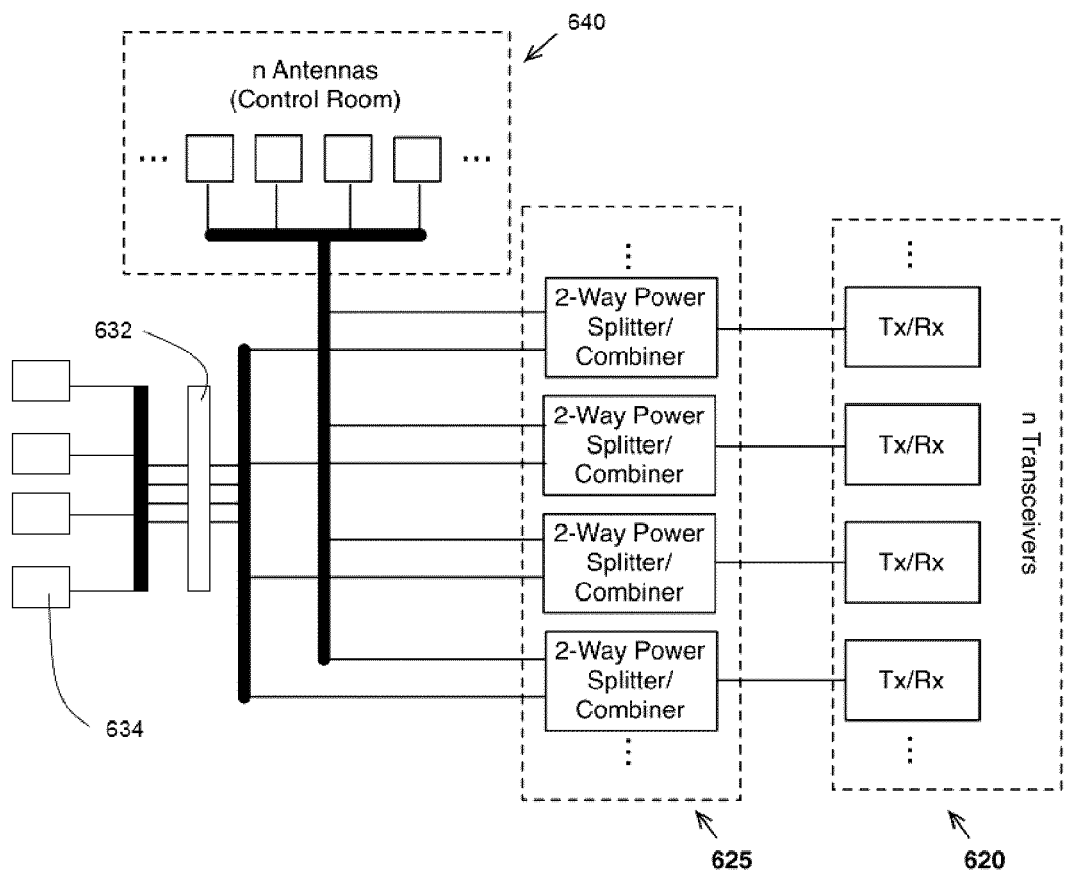
FIG. 13B is a schematic drawing illustrating an example system in which antennae within the Faraday cage are connected to transceivers outside of the Faraday cage through a penetration panel.

FIG. 13B illustrates an alternative embodiment in which one or more antennae 634 (four are shown in the example embodiment) are provided for facilitating wireless communication through the Faraday cage, and where the antennae are connected to one side of penetration panel 632, as opposed to through the waveguide port. Antennae 634 are thus electrically connected to transceivers 620 in the control room through penetration panel 632.

Figure 14:
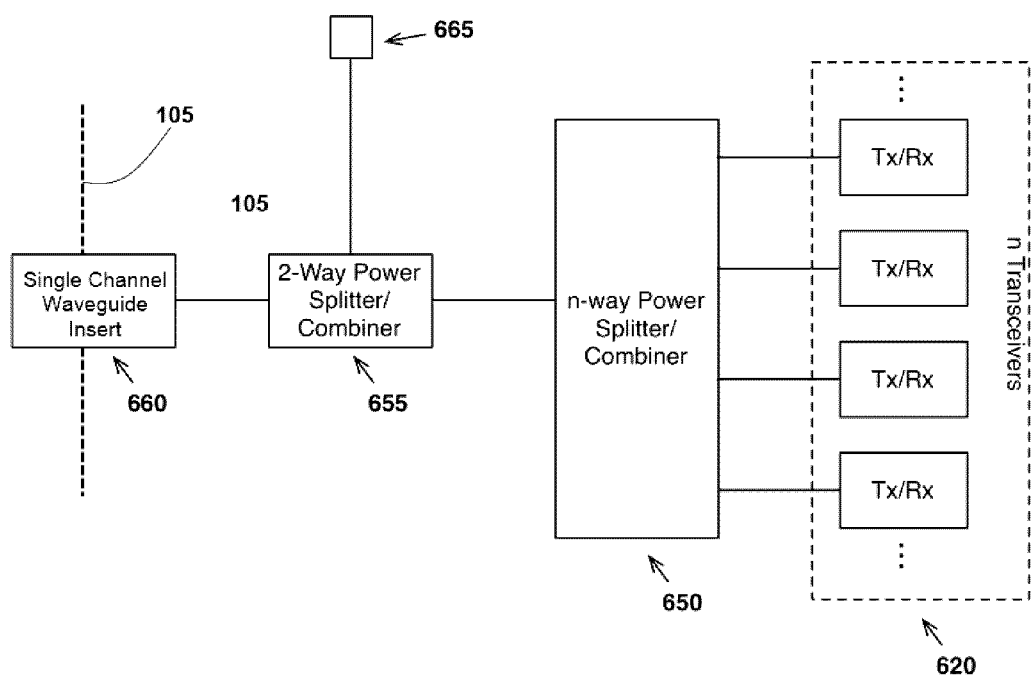
FIG. 14 is a schematic drawing illustrating the use of the single-channel waveguide insert connected to several RF transceivers.

With reference to FIG. 14, an alternative embodiment is illustrated, in which the input and outputs of several RF transceivers 620 are multiplexed through their connection to the isolated ports of a N-way power splitter/combiner 650. The common port is connected to the common port of a 2-way power splitter/combiner 655, the isolated ports of which are connected to a single channel waveguide insert 660 and a single antenna 665 located in the control room. Such a configuration would enable the use of a single antenna within the control room and a single antenna on the waveguide insert device.

Examples of systems that contain transceivers include but are not limited to a computer: that manages the routing of RF signals transmitted through the waveguide insert; that takes as input human vocal or touch actions; that outputs the transmitted RF signals to transducers that produce audio and visual stimuli.

Figure 15:
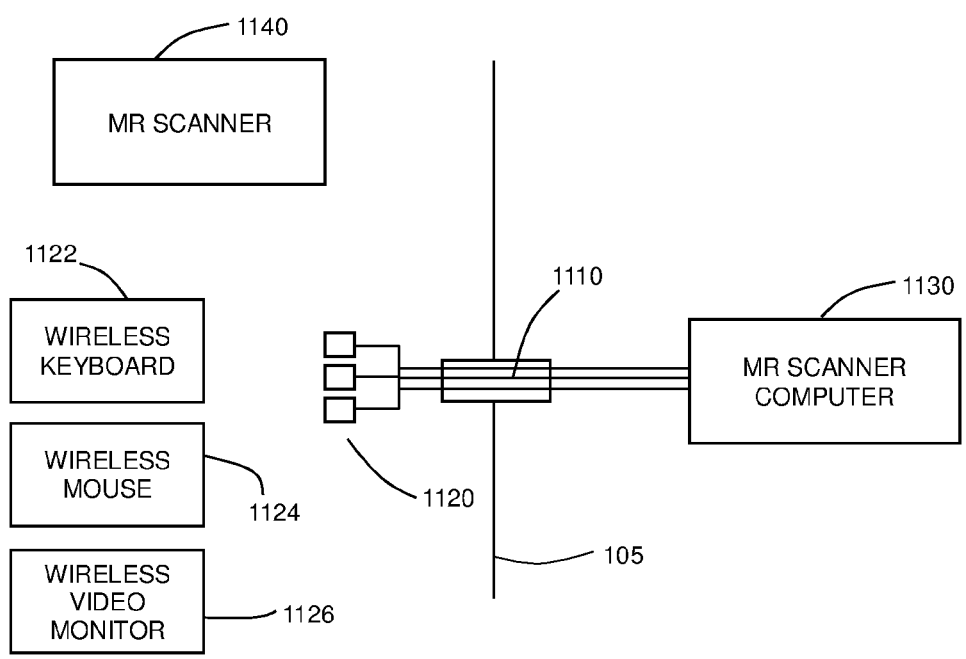
FIG. 15 is alternative example of a wireless communication system configured to allow the wireless control of an external computing device from within a Faraday cage.

In one example embodiment, shown in FIG. 15, the waveguide insert 1100 provides three transmission lines 1110 where the terminals of the transmission lines inside the Faraday cage 105 are RF antennas 1120 wirelessly interfaced with: (1) a wireless keyboard 1122; (2) a wireless mouse 1124; and, (3) a wireless video monitor 1126. The terminals of the transmission lines outside the Faraday cage are electrical connectors interfaced via electrical cables with the host controller/computer 1130 of the MRI scanner 1140 located inside of the Faraday cage. This embodiment illustrates an application of the waveguide insert providing an operator inside of the Faraday cage remote/wireless control of the MRI scanner. This is particularly useful for an operator working alone and needs to operate the scanner while being inside of the MRI scanning room, such as when the operator wishes to scan himself or herself with the MRI scanner.

Figure 16:
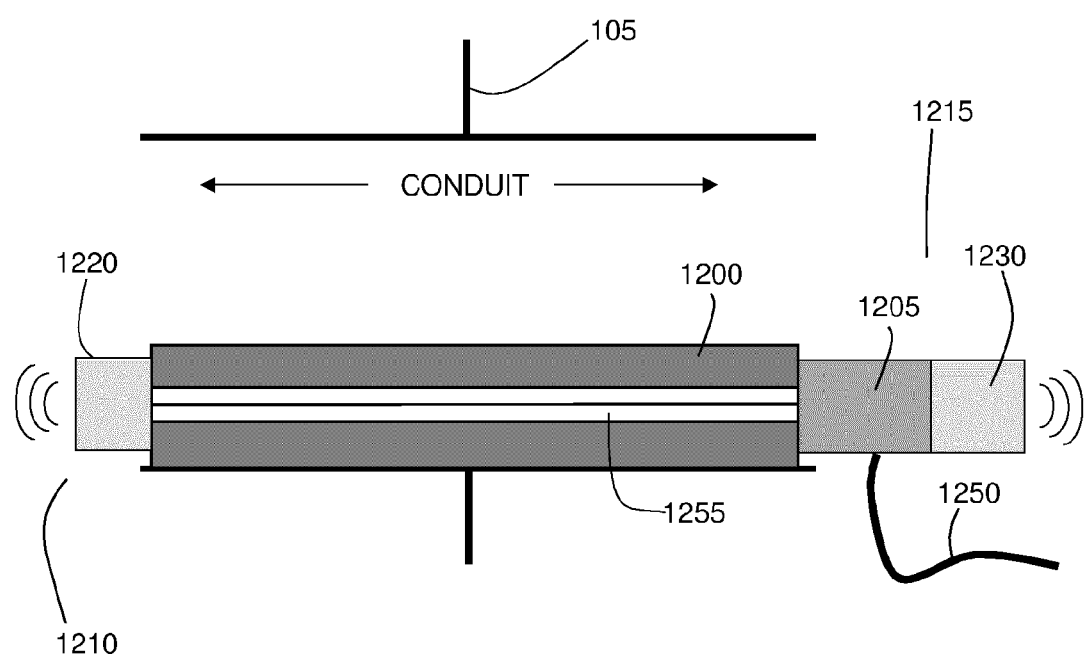
FIG. 16 is an illustration of an example waveguide insert having antenna on either side thereof, within an integrated transceiver on one side of the device.

In many of the preceding embodiments relate to devices and systems in which the transceiver outside of the Faraday cage is connected to an antenna within the Faraday cage. In some of these embodiments, the connection to the transceiver is made through a wired connection, or wirelessly to a waveguide or non-waveguide insert. In an alternative embodiment, shown in FIG. 16, both sides/terminals of a waveguide insert 1200 are configured for wireless transmission, where waveguide insert 1200 includes one or more transceivers 1205. On the side of waveguide insert 1210 within Faraday cage 105, internal antenna 1220 is provided for transmitting and receiving wireless signals within Faraday cage 105. On the side of waveguide insert 1215, outside of Faraday cage 105, both external antenna 1230 and transceiver 1205 are provided. Transceiver 1205 is electrically connected to both internal antenna 1220 and external antenna 1230, where the connection to internal antenna 1220 is made via transmission line 1255 within waveguide insert 1200. Power may be provided to transceiver 1200 either via a battery, or through an external power source via cable 1250. This embodiment provides a self-contained communications transmitter unit that can be permanently or removably secured within waveguide port.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A device for transmitting electrical signals through a waveguide port of a Faraday cage, the device comprising:
at least one shielded transmission line comprising an outer conductor and at least one inner conductor, wherein said shielded transmission line has a length suitable for spanning at least a portion of said waveguide port; and
a support structure configured to support said at least one shielded transmission line within said waveguide port while maintaining electrical contact between said outer conductor and said Faraday cage, such that the presence of said device within said waveguide port does not compromise the function of said waveguide port as a high pass transmission waveguide;
wherein at least one end of said shielded transmission line has an antenna connected thereto, such that when said support structure is inserted within said waveguide port, electrical signals transmitted through said shielded transmission line from one side of said Faraday cage are radiated into the other side of said Faraday cage by said antenna.

2. The device according to claim 1 wherein said support structure is removably insertable within said waveguide port.

3. The device according to claim 1 wherein said support structure has a cross-sectional profile that is selected to maintain an open conduit within said waveguide port when said support structure supports said shielded transmission line.

4. The device according to claim 3 wherein at least one outer portion of said support structure is conductive and is in electrical communication with said outer conductor, and wherein said outer portion is configured to be in electrical contact with an inner surface of said waveguide port when said support structure is inserted within said waveguide port, such that said outer conductor is in electrical communication with said inner surface of said waveguide port.

5. The device according to claim 3 wherein an outer surface of said support structure is electrically conductive and is in electrical communication with said outer conductor, and wherein said outer surface is configured to be in electrical contact with an inner surface of said waveguide port when said support structure is inserted within said waveguide port, such that said outer conductor is in electrical communication with said inner surface of said waveguide port.

6. The device according to claim 1 wherein said support structure is configured to maintain electrical contact between said outer conductor and said waveguide port.

7. The device according to claim 1 wherein said support structure comprises a longitudinal member configured to house said shielded transmission line therein, and wherein at least a portion of an external surface of said longitudinal member is shaped to contact an inner surface of said waveguide port; and
wherein said longitudinal member has a cross-sectional profile such that when said support structure is inserted within said waveguide port, an open conduit is preserved.

8. The device according to claim 7 wherein said longitudinal member is electrically conductive.

9. The device according to claim 1 further comprising an external wire attached to said support structure, such that said external wire is in electrical communication with said outer conductor, wherein a distal portion of said external wire is connectable to said Faraday cage, and wherein said external wire has a length selected to maintain said Faraday cage and said outer conductor at a substantially potential for preserving the operation of said waveguide port as a high pass transmission waveguide.

10. The device according to claim 1 wherein said shielded transmission line is a coaxial transmission line.

11. The device according to claim 1 wherein said antenna is a first antenna, and wherein another end of said shielded transmission line has a second antenna connected thereto.

12. The device according to claim 11 wherein one side of said support structure is connected to a transceiver, and wherein said transceiver is configured to transmit and receive electrical signals to and from said first antenna and said second antenna.

13. The device according to claim 1 further comprising one or more signal conditioning devices in electrical communication with said shielded transmission line.

14. The device according to claim 13 wherein one of said signal conditioning devices is a filter configured to remove any frequency component of the signals within the bandwidth of a magnetic resonance scanner.

15. The device according to claim 13 wherein one of said signal conditioning devices is an impedance matching device.

16. The device according to claim 1 further comprising one or more active electrical devices in electrical communication with said shielded transmission line.

17. The device according to claim 16 further comprising a conductive path for delivering power from an external power source to said one or more active electrical devices, wherein said conductive path only extends partially through said waveguide port, such that the presence of said conductive path within said waveguide port does not compromise the function of said waveguide port as a high pass transmission waveguide.

18. The device according to claim 16 further comprising a bias T configured in electrical communication with said shielded transmission line and said one or more active electrical devices, wherein said bias T is configured to provide a DC voltage to said one or more active devices.

19. A method of transmitting an electrical signal through a waveguide port of a Faraday cage using a waveguide insert, the method comprising:
   providing a waveguide insert according to claim 1;
   inserting the waveguide insert within the waveguide port, such that electrical contact is made between said outer conductor and said waveguide port; and
   transmitting the electrical signal to a first side of said waveguide insert, such that the electrical signal is transmitted through the shielded transmission line from one side of said Faraday cage is radiated into the other side of the Faraday cage by the antenna.

20. A device for transmitting electrical signals through a waveguide port of a Faraday cage, the device comprising:
   at least one shielded transmission line comprising an outer conductor and at least one inner conductor, wherein said shielded transmission line has a length suitable for spanning at least a portion of said waveguide port; and
   a support structure configured to support said at least one shielded transmission line within said waveguide port while maintaining electrical contact between said outer conductor and said Faraday cage, such that the presence of said device within said waveguide port does not compromise the function of said waveguide port as a high pass transmission waveguide;
   wherein said support structure has a cross-sectional profile configured to maintain an open conduit within said waveguide port when said support structure supports said shielded transmission line.

21. The device according to claim 20 wherein said support structure comprises a longitudinal member configured to house said shielded transmission line therein, and wherein at least a portion of an external surface of said longitudinal member is shaped to contact an inner surface of said waveguide port; and
   wherein said longitudinal member has a cross-sectional profile such that when said support structure is inserted within said waveguide port, an open conduit is preserved.

* * * * *